(12) United States Patent
Lee et al.

(10) Patent No.: US 12,288,788 B2
(45) Date of Patent: Apr. 29, 2025

(54) INTEGRATED CIRCUIT DEVICES

(71) Applicant: Samsung Electronics Co., Ltd., Suwon-si (KR)

(72) Inventors: Inyeal Lee, Seongnam-si (KR); Jinwook Kim, Hwaseong-si (KR); Dongbeen Kim, Suwon-si (KR); Deokhan Bae, Suwon-si (KR); Junghoon Seo, Hwaseong-si (KR); Myungyoon Um, Seoul (KR); Jongmil Youn, Yongin-si (KR); Yonggi Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 600 days.

(21) Appl. No.: 17/410,326

(22) Filed: Aug. 24, 2021

(65) Prior Publication Data
US 2022/0085011 A1 Mar. 17, 2022

(30) Foreign Application Priority Data

Sep. 16, 2020 (KR) .......................... 10-2020-0119311

(51) Int. Cl.
H01L 27/088 (2006.01)
H01L 23/50 (2006.01)
(52) U.S. Cl.
CPC .......... *H01L 27/0886* (2013.01); *H01L 23/50* (2013.01)
(58) Field of Classification Search
CPC ............. H01L 27/0886; H01L 27/0207; H01L 21/823431; H01L 21/823481; H01L 21/823878; H01L 23/5286; H01L 29/785
See application file for complete search history.

(56) References Cited

U.S. PATENT DOCUMENTS

| 9,026,975 | B2 | 5/2015 | Song et al. |
| 9,536,968 | B2* | 1/2017 | Park .................... H01L 29/0653 |
| 10,121,702 | B1 | 11/2018 | Park et al. |
| 10,128,187 | B2* | 11/2018 | Zang .................. H01L 29/0653 |
| 10,176,995 | B1 | 1/2019 | Wu et al. |

(Continued)

FOREIGN PATENT DOCUMENTS

| KR | 2018/0038239 A | 4/2018 |
| TW | 202105464 A | 2/2021 |

OTHER PUBLICATIONS

Taiwanese Office Action dated Apr. 19, 2024 for corresponding Taiwanese Patent Application No. 110134243.

(Continued)

*Primary Examiner* — Tuan A Hoang
(74) *Attorney, Agent, or Firm* — HARNESS, DICKEY & PIERCE, P.L.C.

(57) ABSTRACT

An integrated circuit device includes substrate including a fin-type active area extending on the substrate in a first direction parallel to an upper surface of the substrate, a first gate line crossing the fin-type active area on the substrate and extending in a second direction perpendicular to the first direction, a cut gate line extending in the second direction and being spaced apart from the first gate line with a first gate cut area therebetween, a second gate line extending in the second direction and being spaced apart from the cut gate line with a second gate cut area therebetween, and a power wiring disposed on the cut gate line.

20 Claims, 36 Drawing Sheets

(56) References Cited

U.S. PATENT DOCUMENTS

| | | | |
|---|---|---|---|
| 10,199,378 | B2 | 2/2019 | Jain et al. |
| 10,361,198 | B2 | 7/2019 | Rastogi et al. |
| 10,438,982 | B2 | 10/2019 | Kurata et al. |
| 10,468,527 | B2 | 11/2019 | Yang et al. |
| 10,553,698 | B2 | 2/2020 | Zang et al. |
| 10,566,202 | B1 | 2/2020 | Shu et al. |
| 10,586,860 | B2 | 3/2020 | Shu et al. |
| 2019/0304971 | A1 | 10/2019 | Hafez et al. |
| 2019/0393205 | A1* | 12/2019 | Lee .................. G06F 30/392 |
| 2020/0020795 | A1 | 1/2020 | Bao et al. |
| 2020/0051976 | A1 | 2/2020 | Ha et al. |
| 2020/0058508 | A1 | 2/2020 | Yu et al. |
| 2020/0098750 | A1 | 3/2020 | Lin et al. |

OTHER PUBLICATIONS

Korean Office Action dated Sep. 23, 2024 for corresponding Korean Patent Application No. 2020/0119311 and its English-language translation.

* cited by examiner

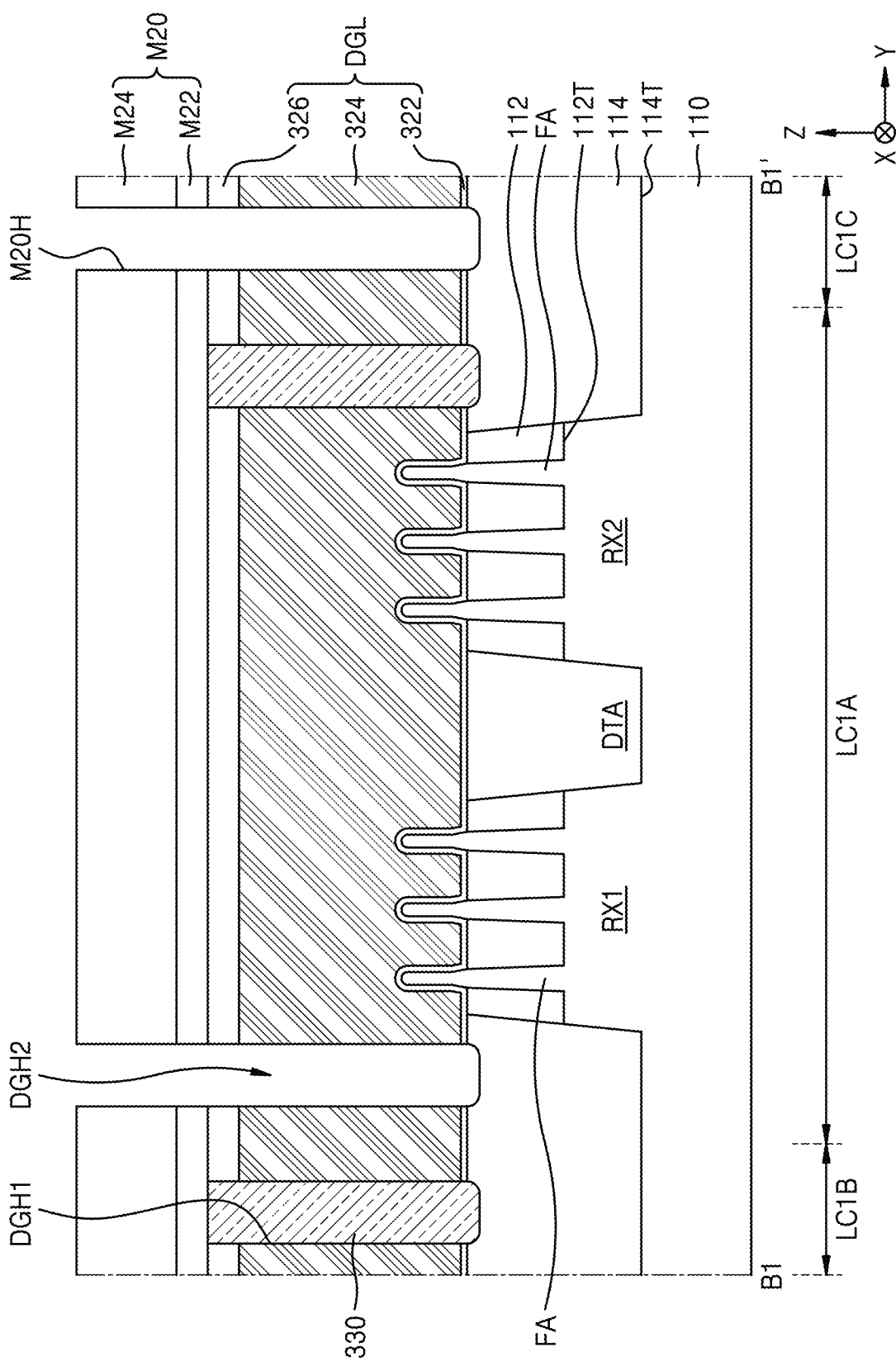

INTEGRATED CIRCUIT DEVICES

CROSS-REFERENCE TO RELATED APPLICATION

This application is based on and claims priority under 35 U.S.C. § 119 to Korean Patent Application No. 10-2020-0119311, filed on Sep. 16, 2020, in the Korean Intellectual Property Office, the disclosure of which is incorporated by reference herein in its entirety.

BACKGROUND

Inventive concepts relate to an integrated circuit device, and more particularly, to an integrated circuit device including a plurality of cell areas.

According to the trend of light and thin electronic products, there is an increasing demand for highly integrated circuit devices. Development of integrated circuit devices that stably secure the insulation distance between wirings and contacts, within a relatively small device area depending on the downscaling of integrated circuit devices, may be required. Development of integrated circuit devices capable of optimizing the performance of integrated circuit devices may be required.

SUMMARY

Inventive concepts provide an integrated circuit device having a reduced device area and/or optimized performance.

According to an example embodiment, an integrated circuit device may include a substrate including a fin-type active area extending on the substrate in a first direction parallel to an upper surface of the substrate; a first gate line crossing the fin-type active area on the substrate and extending in a second direction perpendicular to the first direction; a cut gate line extending in the second direction and being spaced apart from the first gate line with a first gate cut area therebetween; a second gate line extending in the second direction and being spaced apart from the cut gate line with a second gate cut area therebetween; and a power wiring on the cut gate line.

According to an example embodiment, an integrated circuit device may include a substrate including a first active area, a second active area, and a fin-type active area, the fin-type active area extending on the substrate in a first direction parallel to an upper surface of the substrate; a first gate line crossing the fin-type active area on the first active area and the second active area, the first gate line extending in a second direction perpendicular to the first direction; a first cut gate line spaced apart from the first gate line with a first gate separation insulation layer therebetween, the first cut gate line extending in the second direction; a second cut gate line spaced apart from the first gate line with a second gate separation insulation layer therebetween, the second cut gate line extending in the second direction; a first wiring line on the first cut gate line and extending in the first direction; and a second wiring line on the second cut gate line and extending in the first direction.

According to an example embodiment, an integrated circuit device may include a substrate including a fin-type active area extending in a first direction parallel to an upper surface of the substrate. The substrate may define a plurality of cell areas. The plurality of cell areas may include a first cell area and a second cell area adjacent to the first cell area. The first cell area may include a first gate line extending in a second direction perpendicular to the first direction on the substrate, a cut gate line extending in the second direction and being spaced apart from the first gate line with a first gate cut area therebetween, and a second gate line extending in the second direction and being spaced apart from the cut gate line with a second gate cut area therebetween. The second cell area may include a third gate line extending in a second direction perpendicular to the first direction on the substrate, and a fourth gate line extending in the second direction and being spaced apart from the third gate line with a third gate cut area therebetween.

BRIEF DESCRIPTION OF THE DRAWINGS

Embodiments of inventive concepts will be more clearly understood from the following detailed description, taken in conjunction with the accompanying drawings, in which:

FIGS. 13A to 24C are cross-sectional views illustrating a method of manufacturing an integrated circuit device, according to an example embodiment, where FIGS. 13A, 14A, 15A, 16A, 19A, 20A, 21A, 22A, 23A, and 24A are cross-sectional views corresponding to line A1-A1' of FIG. 2, and FIGS. 13B, 14B, 15B, 16B, 17, 18, 19*b*, 20B, 21B, and 24B are cross-sectional views corresponding to line B1-B1' of FIG. 2, and FIGS. 14C, 22B, 23B, and 24C are cross-sectional views corresponding to line B2-B2' of FIG. 2.

DETAILED DESCRIPTION

Hereinafter, embodiments of inventive concepts will be described in detail with reference to the accompanying drawings.

Figure 1:
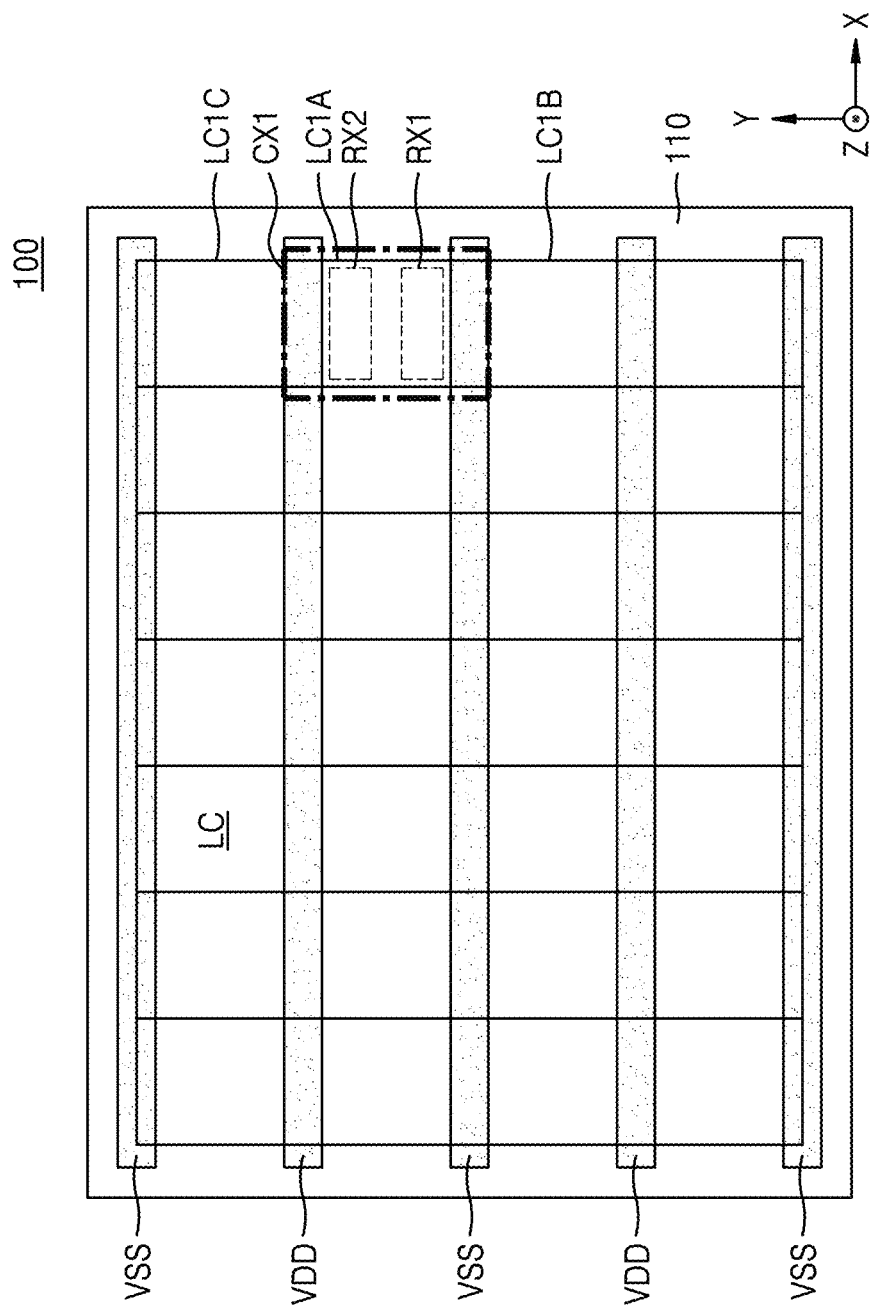
FIG. 1 is a layout diagram illustrating an integrated circuit device according to an example embodiment.
Figure 2:
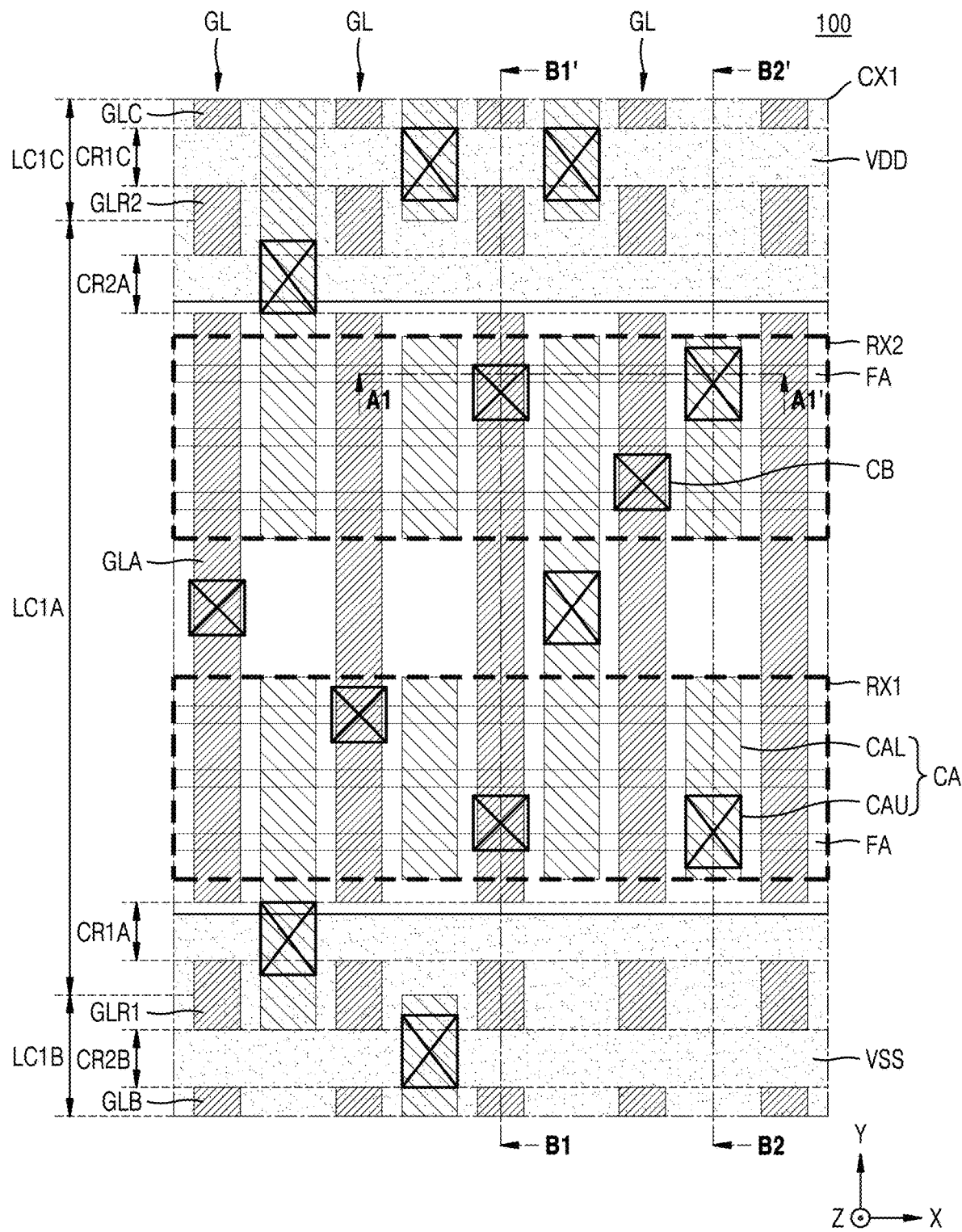
FIG. 2 is a layout diagram of a region CX1 of FIG. 1.
Figure 3:
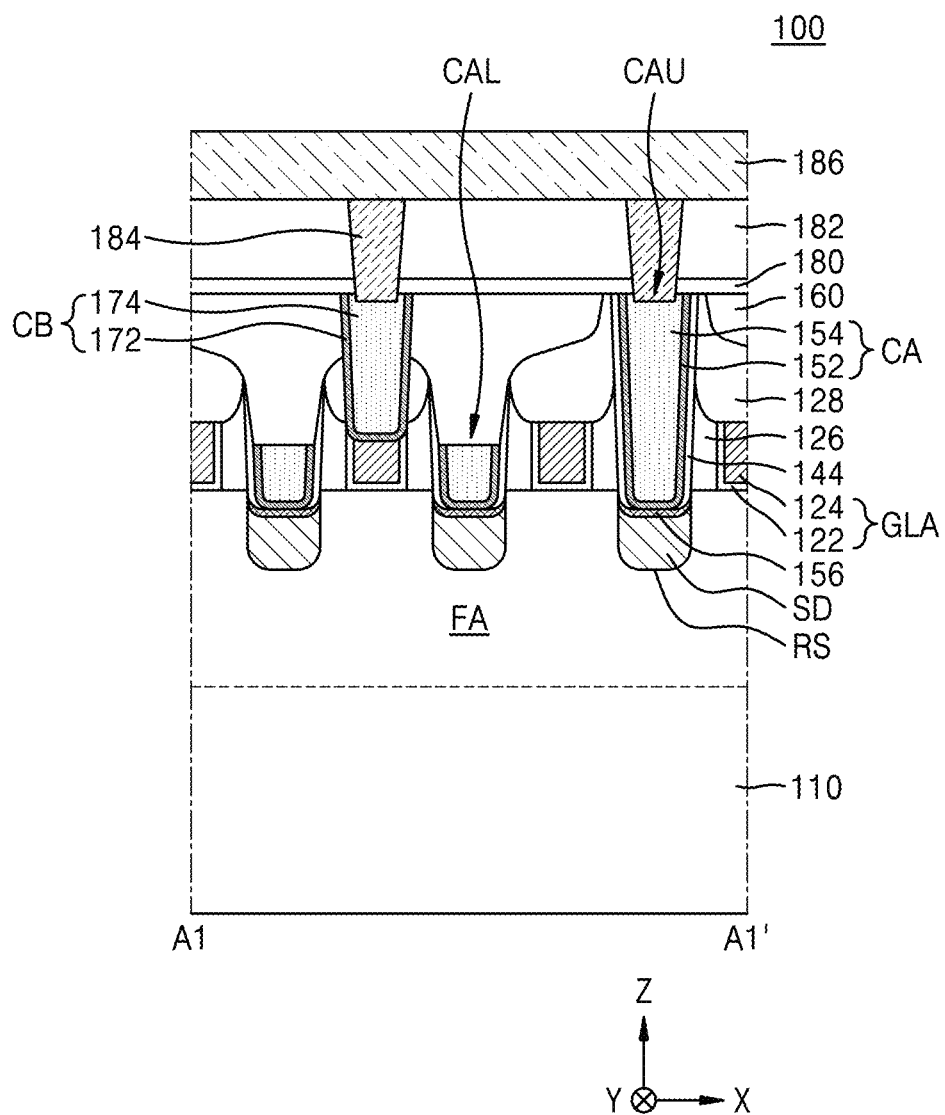
FIG. 3 is a cross-sectional view taken along line A1-A1' of FIG. 2.
Figure 4:
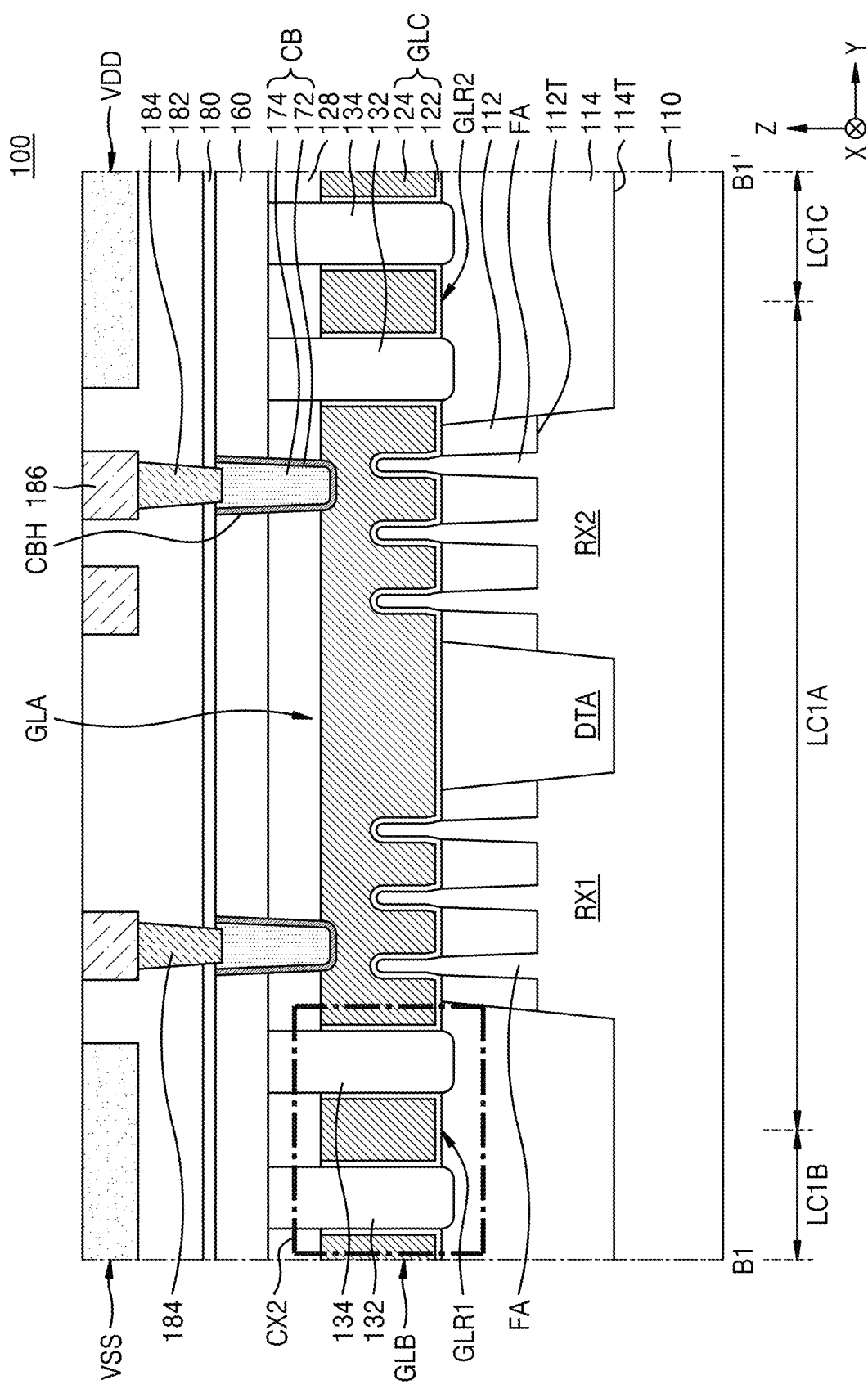
FIG. 4 is a cross-sectional view taken along line B1-B1' of FIG. 2.
Figure 5:
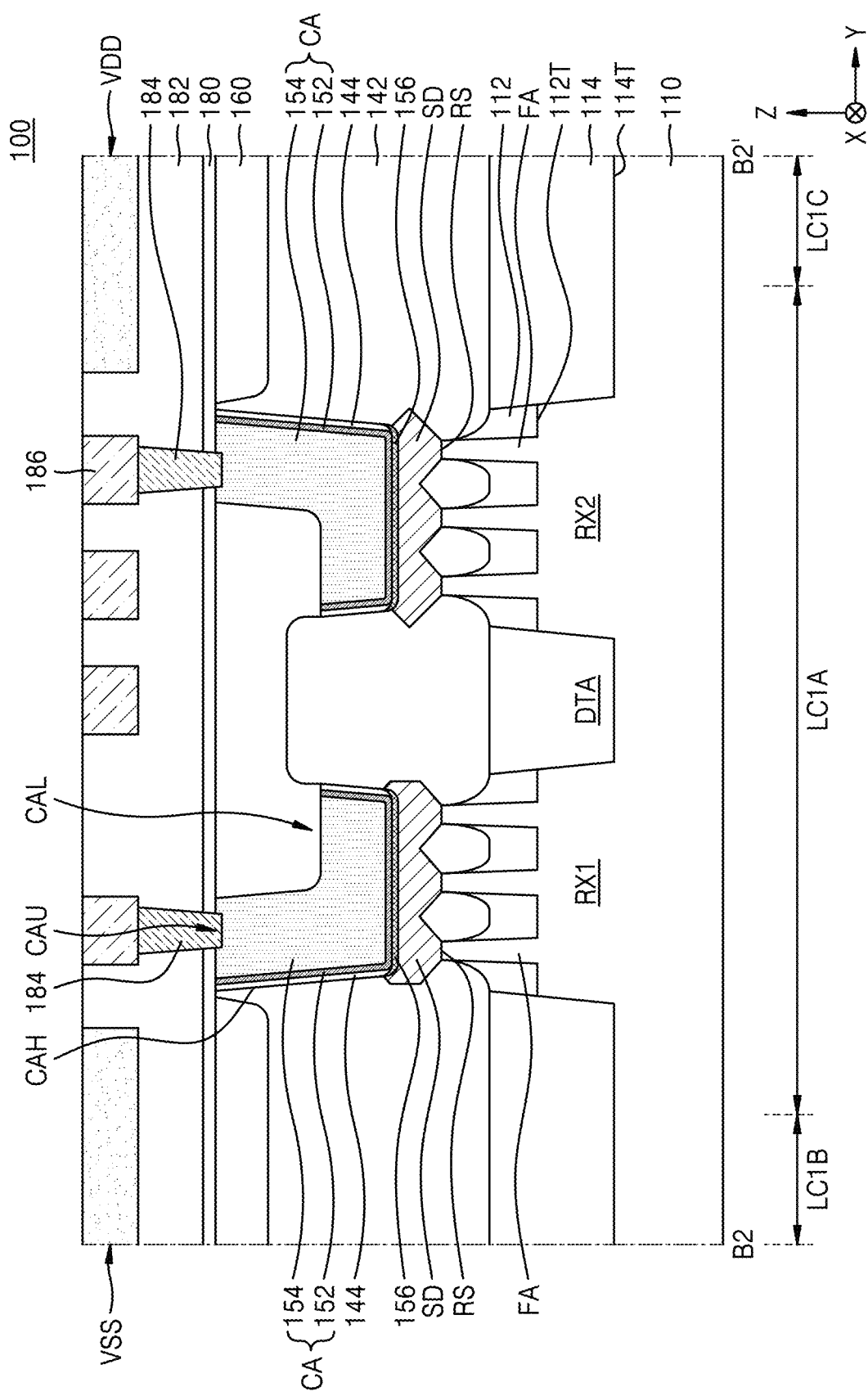
FIG. 5 is a cross-sectional view taken along line B2-B2' of FIG. 2.
Figure 6:
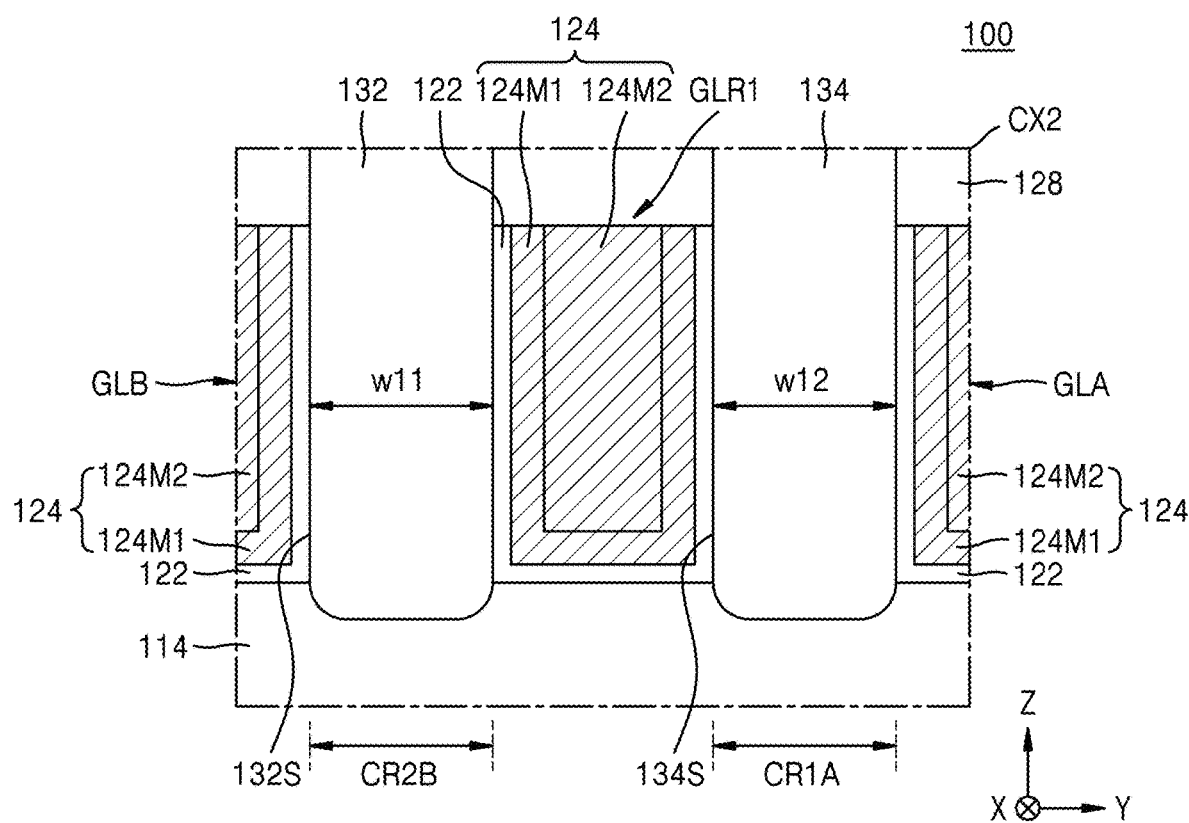
FIG. 6 is an enlarged cross-sectional view of a region CX2 of FIG. 4.

FIG. 1 is a layout diagram illustrating an integrated circuit device 100 according to an example embodiment. FIG. 2 is a layout diagram of a region CX1 of FIG. 1. FIG. 3 is a cross-sectional view taken along line A1-A1' of FIG. 2, FIG. 4 is a cross-sectional view taken along line B1-B1' of FIG. 2, and FIG. 5 is a cross-sectional view along line B2-B2' of FIG. 2. FIG. 6 is an enlarged cross-sectional view of a region CX2 of FIG. 4. In FIGS. 1 and 2, some components of the integrated circuit device 100 are omitted for convenience of illustration.

Referring to FIGS. 1 to 4, the integrated circuit device 100 may include a substrate 110 on which a plurality of cell areas LC are defined. The plurality of cell areas LC may be an area in which a logic circuit block having various functions is formed. For example, the logic circuit block may include an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D flip-flop, a reset flip-flop, a master-slave flip-flop, a latch, and the like.

In the embodiments illustrated in FIGS. 1 to 4, the integrated circuit device 100 may constitute a logic cell including a finFET element. However, embodiments of inventive concepts are not limited thereto, and the integrated circuit device 100 may include a planar FET device, a gate-all-around type FET device, a multi-bridge channel FET (MBCFET) device, a two-dimensional material-based FET device such as a $MoS_2$ semiconductor device, and the like.

As illustrated in FIG. 1, a plurality of cell areas LC may be arranged in a matrix form in a first direction X and a second direction Y on the substrate 110, and the power line VDD and the ground line VSS may extend in the first direction X and may be alternately disposed. Here, the power line VDD and the ground line VSS may be collectively referred to as power wiring. The power line VDD may be shared by two adjacent cell areas LC (e.g., a first cell area LC1A and a third cell area LC1C) in the second direction Y, and the ground line VSS may be shared by two adjacent cell areas LC (e.g., the first cell area LC1A and the second cell area LC1B) in the second direction Y.

The substrate 110 may include a first active area RX1, a second active area RX2, and a deep trench area DTA. The first active area RX1 and the second active area RX2 may be apart from each other with the deep trench area DTA therebetween.

In an example embodiment, the first active area RX1 may be an active area for an NMOS transistor, and the second active area RX2 may be an active area for a PMOS transistor. In other embodiments, the first active area RX1 may be an active area for an NMOS transistor having a first threshold voltage, and the second active area RX2 may be an active area for an NMOS transistor having a second threshold voltage, the second threshold voltage being different from the first threshold voltage.

A plurality of fin-type active areas FA may protrude from the upper surface of the substrate 110 and may be disposed on the first active area RX1 and the second active area RX2, and the plurality of fin-type active areas FA may extend in a first direction (X direction). Both sidewalls of the plurality of fin-type active areas FA may be covered by an isolation layer 112. A deep trench 114T may be formed to a desired and/or alternatively predetermined depth from the upper surface of the substrate 110 in the deep trench area DTA, and a deep trench insulation layer 114 may fill the inside of the deep trench 114T.

In an example embodiment, the substrate 110 may include a Group IV semiconductor such as Si or Ge, a Group IV-IV compound semiconductor such as SiGe or SiC, or a Group III-V compound semiconductor such as GaAs, InAs, or InP. The substrate 110 may include a conductive area, for example, a well doped with an impurity, or a structure doped with an impurity.

The gate line GL may extend in the second direction (Y direction) so as to intersect the plurality of fin-type active areas FA on the first and second active areas RX1 and RX2. The gate line GL of each of the plurality of cell areas LC may be disposed to be spaced apart from the gate line GL of the cell area LC adjacent thereto. For example, the first gate line GLA of the first cell area LC1A may be disposed to be spaced apart from the second gate line GLB of the second cell area LC1B in the second direction Y, and the first gate line GLA in the first cell area LC1A may be disposed to be spaced apart from the third gate line GLC in the third cell area LC1C. The first gate line GLA, the second gate line GLB, and the third gate line GLC may be disposed on a straight line.

The gate line GL may include a gate insulation layer 122 and a gate electrode 124. A gate spacer 126 may be disposed on a sidewall of the gate line GL, and a gate capping layer 128 may be disposed on the gate line GL and the gate spacer 126.

The gate electrode 124 may include doped polysilicon, metal, conductive metal nitride, conductive metal carbide, conductive metal silicide, or a combination thereof. For example, the gate electrode 124 may be formed of Al, Cu, Ti, Ta, W, Mo, TaN, NiSi, CoSi, TiN, WN, TiAl, TiAlN, TaCN, TaC, TaSiN, or a combination thereof, but is not limited thereto. In an example embodiment, the gate electrode 124 may include a work function metal containing layer 124M1 and a gap-fill metal film 124M2. The work function metal containing layer 124M1 may include at least one metal selected from Ti, W, Ru, Nb, Mo, Hf, Ni, Co, Pt, Yb, Tb, Dy, Er, and Pd. The gap-fill metal film 124M2 may include a W film or an Al film. In an example embodiment, the gate electrode 124 may include a stack structure of TiAlC/TiN/W, a stack structure of TiN/TaN/TiAlC/TiN/W, or a stack structure of TiN/TaN/TiN/TiAlC/TiN/W, but is not limited thereto.

The gate insulation layer 122 may be disposed to extend in the second direction on the bottom surface and sidewall of the gate electrode 124. The gate insulation layer 122 may be between the gate electrode 124 and the fin-type active area FA, and between the gate electrode 124 and the upper surface of the isolation layer 112. The gate insulation layer 122 may include a silicon oxide film, a silicon oxynitride film, a high-k dielectric film having a higher dielectric constant than that of the silicon oxide film, or a combination thereof. The high-k dielectric film may be made of a metal oxide or a metal oxynitride. For example, the high-k dielectric film usable as the gate insulation layer 122 may be formed of $HfO_2$, HfSiO, HfSiON, HfTaO, HfTiO, HfZrO, $ZrO_2$, $Al_2O_3$, BN, or a combination thereof, but is not limited thereto.

The gate spacer 126 covers both sidewalls of the gate line GL and may extend in the second direction Y. The gate spacer 126 may include silicon oxide ($SiO_x$), silicon nitride ($SiN_x$), silicon oxynitride ($SiO_xN_y$), silicon carbonitride ($SiC_xN_y$), silicon oxycarbonitride ($SiO_xC_yN_z$), or a combination thereof.

In an example embodiment, the gate spacer 126 may include a plurality of layers made of different materials. FIG. 3 illustrates that the gate spacer 126 is configured as a single layer, but alternatively, the gate spacer 126 may include a first spacer layer (not shown), a second spacer layer (not shown), and a third spacer layer (not shown) sequentially stacked on the sidewall of the gate electrode 124. In an example embodiment, the first spacer layer and the third spacer layer may include silicon nitride, silicon oxide, or silicon oxynitride. The second spacer layer may include an insulating material having a lower dielectric constant than the first spacer layer. In some embodiments, the second spacer layer may include an air space.

The gate capping layer 128 may cover the upper surface of the gate line GL and the gate spacer 126 and may extend in the second direction Y. In an example embodiment, the gate capping layer 128 may include silicon nitride or silicon oxynitride. As shown in FIG. 3, at least a portion of the gate capping layer 128 may have an uneven upper surface. For example, at least a portion of the gate capping layer 128 may have a convex upper surface protruding upward, and the upper surface level of the portion of the gate capping layer 128 disposed on the gate electrode 124 may be higher than the upper surface level of the portion of the gate capping layer 128 disposed on the gate spacer 126.

As illustrated in FIG. 2, the first cell area LC1A includes a first gate line GLA, a first cut gate line GLR1 and a second cut gate line GLR2 disposed on both sides of the first gate line GLA. The first cut gate line GLR1 and the second cut gate line GLR2 may be disposed to vertically overlap the ground line VSS and the power line VDD, respectively.

The first gate line GLA and the first cut gate line GLR1 may be disposed to be spaced apart in the second direction Y with the lower gate cut area CR1A therebetween, and a lower gate separation insulation layer 134 may be disposed in the lower gate cut area CR1A. The first gate line GLA and the second cut gate line GLR2 may be disposed to be spaced apart in the second direction Y with an upper gate cut area CR2A therebetween, and an upper gate separation insulation layer 132 may be disposed in the upper gate cut area CR2A.

In an example embodiment, the upper gate separation insulation layer 132 and the lower gate separation insulation layer 134 may include silicon oxide ($SiO_x$), silicon nitride ($SiN_x$), silicon oxynitride ($SiO_xN_y$), and silicon carbonitride ($SiC_xN_y$), silicon oxide carbonitride ($SiO_xC_yN_z$), or a combination thereof. The upper gate separation insulation layer 132 and the lower gate separation insulation layer 134 may have upper surfaces disposed at the same level as an upper surface of the gate capping layer 128, and the bottom surfaces of the upper gate separation insulation layer 132 and the lower gate separation insulation layer 134 may contact the deep trench insulation layer 114.

The upper gate cut area CR2A may be areas corresponding to a first sacrificial gate contact hole DGH1 formed by removing a portion of a sacrificial gate line DGL (refer to FIG. 14B), and for example, a cross-sectional shape of the upper gate cut area CR2A may correspond to the shape of a first mask pattern M10 (in particular, an opening part M10H of the first mask pattern M10) (see FIG. 15B) for forming the first sacrificial gate contact hole DGH1. Further, the lower gate cut area CR1A may be areas corresponding to a second sacrificial gate contact hole DGH2 formed by removing a portion of a sacrificial gate line DGL (refer to FIG. 14B), and for example, a cross-sectional shape of the lower gate cut area CR1A may correspond to the shape of a second mask pattern M20 (in particular, an opening part M20H of the second mask pattern M20) for forming the second sacrificial gate contact hole DGH2.

Between the first gate line GLA of the first cell area LC1A and the second gate line GLB of the second cell area LC1B, the lower gate cut area CR1A of the first cell area LC1A, the first cut gate line GLR1, and the upper gate cut area CR2B of the second cell area LC1B may be disposed in order in the second direction Y, and the first gate line GLA, the first cut gate line GLR1, and the second gate line GLB may be disposed on a straight line.

Likewise, between the first gate line GLA of the first cell area LC1A and the third gate line GLC of the third cell area LC1C, the upper gate cut area CR2A of the first cell area LC1A, the second cut gate line GLR2, and the lower gate cut area CR1C of the third cell area LC1C may be disposed in order in the second direction Y, and the first gate line GLA, the second cut gate line GLR2, and the third gate line GLC may be disposed on a straight line.

Similar to the gate line GL, the first cut gate line GLR1 and the second cut gate line GLR2 may include a gate insulation layer 122 and a gate electrode 124. The gate insulation layer 122 may surround the sidewall of the gate electrode 124 and may contact a sidewall 132S of the upper gate separation insulation layer 132 and a sidewall 134S of the lower gate separation insulation layer 134, and the gate electrode 124 may not directly contact the upper gate separation insulation layer 132 and the lower gate separation insulation layer 134.

In an example embodiment, the first cut gate line GLR1 and the second cut gate line GLR2 may be metal islands that are not electrically connected to a wiring layer 186. In other embodiments, a gate contact CB is further formed on the first cut gate line GLR1 and the second cut gate line GLR2, and the first cut gate line GLR1 and the second cut gate line GLR2 may be connected to some nodes of a logic circuit block of the cell area LC through a gate contact CB.

In an example embodiment, the upper gate separation insulation layer 132 may have a first width w11 in the second direction Y, and the lower gate separation insulation layer 134 may have a second width w12 in the second direction Y. For example, the first width w11 and the second width w12 may range from about 10 nm to about 120 nm, but are not limited thereto. In some examples, the first width w11 and the second width w12 may range from about 10 nm to about 60 nm. The distance in the second direction Y between the upper gate separation insulation layer 132 and the lower gate separation insulation layer 134 may range from about 10 nm to about 120 nm, but is not limited thereto. In some examples, the distance in the second direction Y between the upper gate separation insulation layer 132 and the lower gate separation insulation layer 134 may range from about 20 nm to about 60 nm.

In some embodiments, the upper gate cut area CR2A and the lower gate cut area CR1A may be areas simultaneously patterned by a mask pattern formed by exposure to extreme ultraviolet rays. For example, a mask pattern may be formed using a photoresist material, which is a photosensitive polymer material that has chemical properties that are changed by exposure to extreme ultraviolet rays having a wavelength of about 13.5 nm or less than about 11 nm, and the upper gate cut area CR2A and the lower gate cut area CR1A may be patterned using the mask pattern. In this case, the upper gate cut area CR2A and the lower gate cut area CR1A may be aligned at the same distance with respect to each other without misalignment over their entire length. Accordingly, the upper gate separation insulation layer 132 and the lower gate separation insulation layer 134 may be disposed to be spaced apart from each other by the same distance over the entire width of the cell area LC in the first direction X. In addition, when EUV exposure is used to form the mask pattern, process defects in the patterning process may be limited and/or prevented.

A recess area RS extending into the fin-type active area FA on both sides of the gate line GL may be formed on the first active area RX1 and the second active area RX2, and a source/drain area SD may be formed inside the recess area RS.

The source/drain area SD is formed in the recess area RS and may have a plurality of inclined sidewalls (not shown). The source/drain area SD may be formed of a doped SiGe film, a doped Ge film, a doped SiC film, or a doped InGaAs film, but is not limited thereto. A recess area RS is formed by removing a portion of the fin-type active area FA on both sides of the gate line GL, and the source/drain areas SD may be formed by growing a semiconductor layer filling the recess area RS by an epitaxy process.

In an example embodiment, when the fin-type active area FA is the active area for the NMOS transistor, the source/drain area SD may include doped SiC, and when the fin-type active area FA is the active area for the PMOS transistor, the source/drain area SD may include doped SiGe. However, embodiments of inventive concepts are not limited thereto.

In an example embodiment, the source/drain area SD may be formed of a plurality of semiconductor layers having different compositions. For example, the source/drain area SD may include a lower semiconductor layer (not shown), an upper semiconductor layer (not shown), and a capping semiconductor layer (not shown) that sequentially fill the recess area RS. For example, the lower semiconductor layer, the upper semiconductor layer, and the capping semiconductor layer may each include SiC and may have different Si and C contents.

Although not shown in the drawing, an etch stop layer (not shown) may be further formed on the sidewalls of the source/drain areas SD and the upper surface of the isolation layer 112. The etch stop layer may include at least one of silicon nitride, silicon oxynitride, silicon oxycarbide nitride, and silicon oxide.

An inter-gate insulation layer 142 may be formed between the gate lines GL to cover the source/drain area SD. The inter-gate insulation layer 142 may include silicon oxide or silicon oxynitride.

The source/drain contact CA may be disposed on the source/drain area SD in the source/drain contact hole CAH penetrating the inter-gate insulation layer 142. A contact liner 144 surrounding sidewalls of the source/drain contact CA may be further disposed in the source/drain contact hole CAH. The contact liner 144 may include a metal material including at least one of Ti, W, Ru, Nb, Mo, Hf, Ni, Co, Pt, Yb, Tb, Dy, Er, and Pd. In an example embodiment, an insulating liner (not shown) including silicon nitride may be further formed between the contact liner 144 and the gate spacer 126 or between the contact liner 144 and the inter-gate insulation layer 142.

The source/drain contact CA may include a conductive barrier layer 152 disposed on the inner wall of the source/drain contact hole CAH, and a contact plug 154 surrounded by the conductive barrier layer 152 and filling the inside of the source/drain contact hole CAH. The conductive barrier layer 152 may include at least one of ruthenium (Ru), titanium (Ti), titanium nitride (TiN), tantalum (Ta), tantalum nitride (TaN), tungsten (W), titanium silicon nitride (TiSiN), and titanium silicide (TiSi), and tungsten silicide (WSi). The contact plug 154 may include at least one of tungsten (W), cobalt (Co), nickel (Ni), ruthenium (Ru), copper (Cu), aluminum (Al), and silicides thereof, or alloys thereof. A metal silicide layer 156 may be further disposed between the source/drain contact CA and the source/drain area SD.

The source/drain contact CA may include a first portion CAU and a second portion CAL, and the upper surface of the second portion CAL may be at a lower level than the upper surface of the first portion CAU. As illustrated in FIG. 5, the first portion CAU and the second portion CAL each have a flat upper surface and may be integrally connected to each other. However, the shape of the source/drain contact CA is not limited thereto, and in other embodiments, the source/drain contact CA may have an upper surface disposed at the same level over its entire length.

The buried insulation layer 160 may cover the sidewall of the first portion CAU of the source/drain contact CA, the upper surface of the second portion CAL of the source/drain contact CA, and the gate capping layer 128. In an example embodiment, the buried insulation layer 160 may include at least one of SiOC, SiON, SiCN, SiN, Tonen SilaZene (TOSZ), tetraethyl orthosilicate (TEOS), ALD oxide, a flowable chemical vapor deposition (FCVD) oxide, a high density plasma (HDP) oxide, and a plasma enhanced oxidation (PEOX) oxide.

The gate contact CB may be disposed to be connected to the gate electrode 124 on the first active area RX1 and the second active area RX2. For example, the gate contact CB may be disposed in the gate contact hole CBH penetrating the buried insulation layer 160 and the gate capping layer 128, and the bottom part of the gate contact CB may be connected to the gate electrode 124. The gate contact CB may include a conductive barrier layer 172 disposed on an inner wall of the gate contact hole CBH, and a contact plug 174 surrounded by the conductive barrier layer 172 and filling the inside of the gate contact hole CBH.

An etch stop layer 180 and an interlayer insulation film 182 may be disposed on the source/drain contact CA, the buried insulation layer 160, and the gate contact CB. The etch stop layer 180 may be formed of silicon carbide (SiC), SiN, nitrogen-doped silicon carbide (SiC:N), SiOC, AlN, AlON, AlO, AlOC, or a combination thereof. The interlayer insulation film 182 include an oxide film, a nitride film, an ultra low-k (ULK) film having an ultra low dielectric constant k of about 2.2 to about 2.4, or a combination thereof.

The conductive via 184 may pass through the interlayer insulation film 182 and the etch stop layer 180 to be connected to the first portion CAU of the source/drain contact CA and the gate contact CB.

A wiring layer 186 may be disposed on the conductive via 184. For example, the wiring layer 186 may include a power line VDD configured to apply a power voltage to the source/drain area SD through the source/drain contact CA, a ground line VSS configured to apply a ground voltage to the source/drain area SD through the source/drain contact CA, and a signal line arranged parallel to the power line VDD and the ground line VSS, and connected to at least one of the source/drain contact CA and the gate contact CB.

According to the above-described embodiments, the lower gate cut area CR1A, the first cut gate line GLR1, and the upper gate cut area CR2B are sequentially disposed between the first gate line GLA and the second gate line GLB. Accordingly, a relatively wide separation area (or a relatively wide separation distance) between the first cell area LC1A and the second cell area LC1B may be secured. Therefore, the parasitic capacitance that may occur when the source/drain contact CA is arranged close to the first gate line GLA may be significantly reduced, and accordingly, the integrated circuit device 100 may have excellent electrical characteristics. In addition, according to the above-described embodiments, the lower gate cut area CR1A having a relatively small width is formed between the first cut gate line GLR1 and the first gate line GLA, and the upper gate cut area CR2B having a relatively small width is formed between the first cut gate line GLR1 and the second gate line GLB. Accordingly, a filling failure (or insufficient filling) of the insulating material, which may occur when one gate separation layer is formed to fill one gate separation area having a relatively large width between the first gate line GLA and the second gate line GLB, may be limited and/or prevented.

Figure 7:
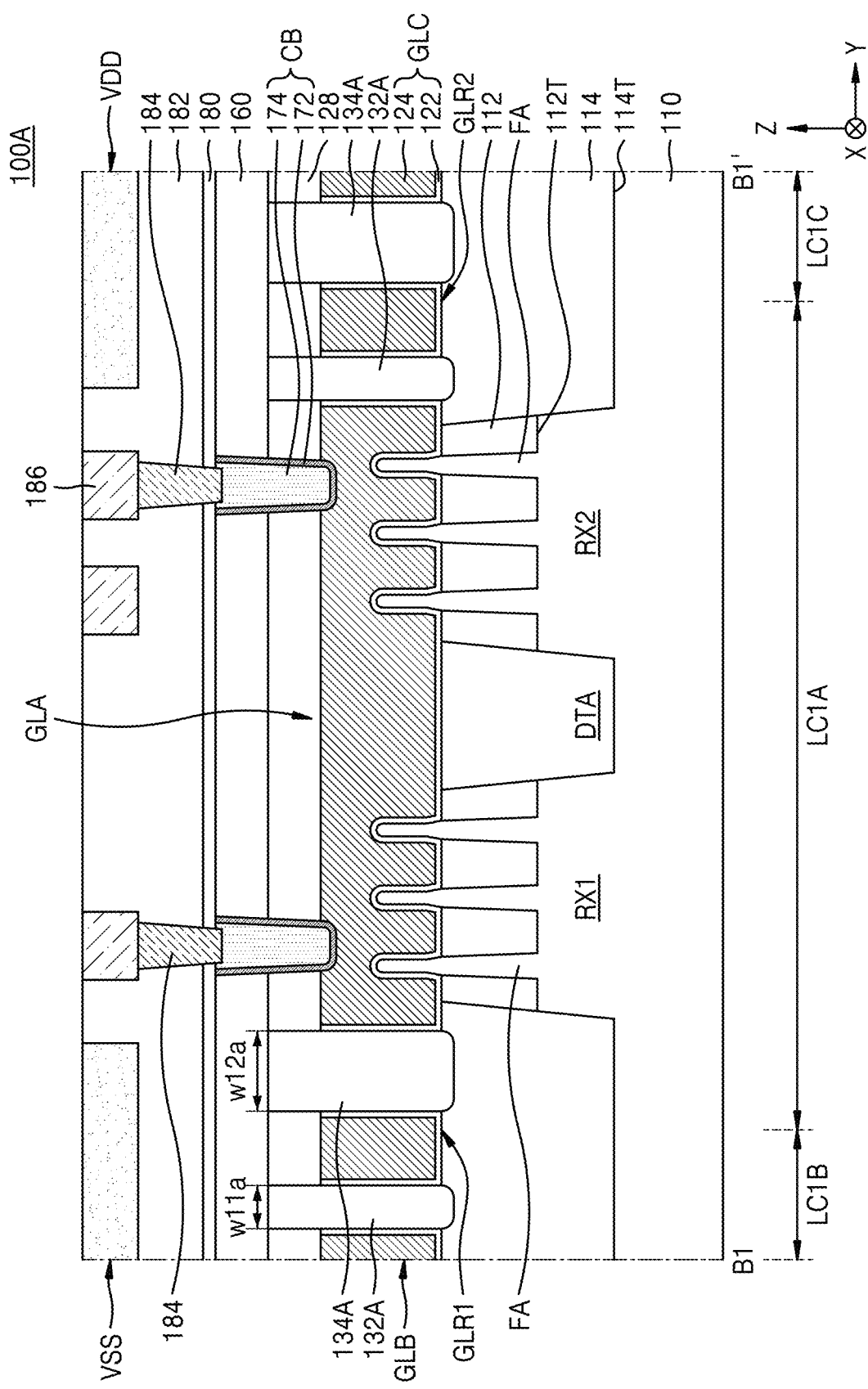
FIG. 7 is a cross-sectional view illustrating an integrated circuit device according to an example embodiment.

FIG. 7 is a cross-sectional view illustrating an integrated circuit device 100A according to an example embodiment. FIG. 7 is a cross-sectional view of a portion corresponding to line B1-B1' of FIG. 2. In FIG. 7, the same reference numerals as in FIGS. 1 to 6 denote the same components.

Referring to FIG. 7, an upper gate separation insulation layer 132A may have a first width w11a in the second direction Y, and a lower gate separation insulation layer 134A may have a second width w12a in the second direction Y. The second width w12a may be different from the first width w11a.

For example, the first width w11 and the second width w12 may range from about 10 nm to about 120 nm, but are not limited thereto. In some examples, the first width w11 and the second width w12 may range from about 10 nm to about 60 nm.

In an example embodiment, a first sacrificial gate contact hole DGH1 is formed by removing a portion of the sacrificial gate line DGL (see FIG. 15B) using the first mask pattern M10 (see FIG. 15B), and thereafter, a portion of the sacrificial gate line DGL may be removed using the second mask pattern M20 (refer to FIG. 16B) to form the second sacrificial gate contact hole DGH2. Thereafter, the upper gate separation insulation layer 132A and the lower gate separation insulation layer 134A may be formed by filling the first sacrificial gate contact hole DGH1 and the second sacrificial gate contact hole DGH2 with an insulating material.

In some embodiments, the electrical performance required for the transistor formed in the first active area RX1 may be different from that of the transistor formed in the second active area RX2, and in this case, as the upper gate separation insulation layer 132A and the lower gate separation insulation layer 134A are formed with different widths, the electrical performance of the integrated circuit device 100A may be optimized.

Figure 8:
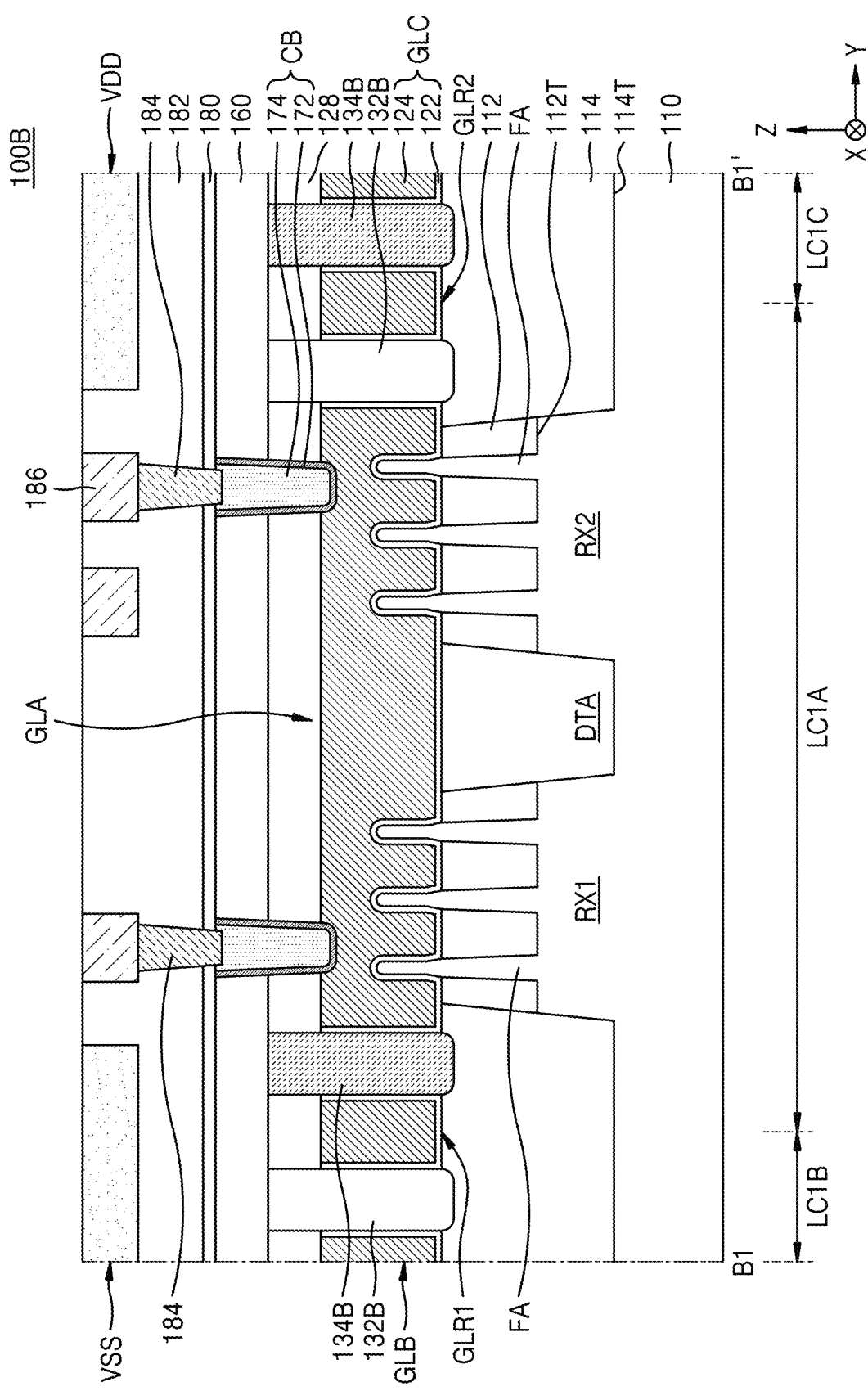
FIG. 8 is a cross-sectional view illustrating an integrated circuit device according to an example embodiment.

FIG. 8 is a cross-sectional view illustrating an integrated circuit device 100B according to an example embodiment. FIG. 8 is a cross-sectional view of a portion corresponding to line B1-B1' of FIG. 2. In FIG. 8, the same reference numerals as in FIGS. 1 to 7 denote the same components.

Referring to FIG. 8, the upper gate separation insulation layer 132B may include a first insulating material, and the lower gate separation insulation layer 134B may include a second insulating material, the second insulating material being different from the first insulating material. The first insulating material and the second insulating material may include silicon oxide ($SiO_x$), silicon nitride ($SiN_x$), silicon oxynitride ($SiO_xN_y$), silicon carbonitride ($SiC_xN_y$), silicon oxycarbide nitride ($SiO_xC_yN_z$), or a combination thereof.

In an example embodiment, a first sacrificial gate contact hole DGH1 is formed by removing a portion of the sacrificial gate line DGL (see FIG. 15B) using the first mask pattern M10 (see FIG. 15B), and the upper gate separation insulation layer 132B may be formed by filling the inside of the first sacrificial gate contact hole DGH1 with a first insulating material. Thereafter, a portion of the sacrificial gate line DGL is removed using the second mask pattern M20 (see FIG. 16B) to form a second sacrificial gate contact hole DGH2, and the lower gate separation insulation layer 134B may be formed by filling the inside of the second sacrificial gate contact hole DGH2 with a second insulating material.

In some embodiments, the electrical performance required for the transistor formed in the first active area RX1 may be different from that of the transistor formed in the second active area RX2, and in this case, as the upper gate separation insulation layer 132B and the lower gate separation insulation layer 134B are formed with different materials, the electrical performance of the integrated circuit device 100B may be optimized. In some examples, when a PMOS transistor is formed in the first active area RX1 and an NMOS transistor is formed in the second active area RX2, the lower gate separation insulation layer 134B includes silicon nitride, and the upper gate separation insulation layer 132B may include a double layer of silicon oxide and silicon nitride.

Figure 9:
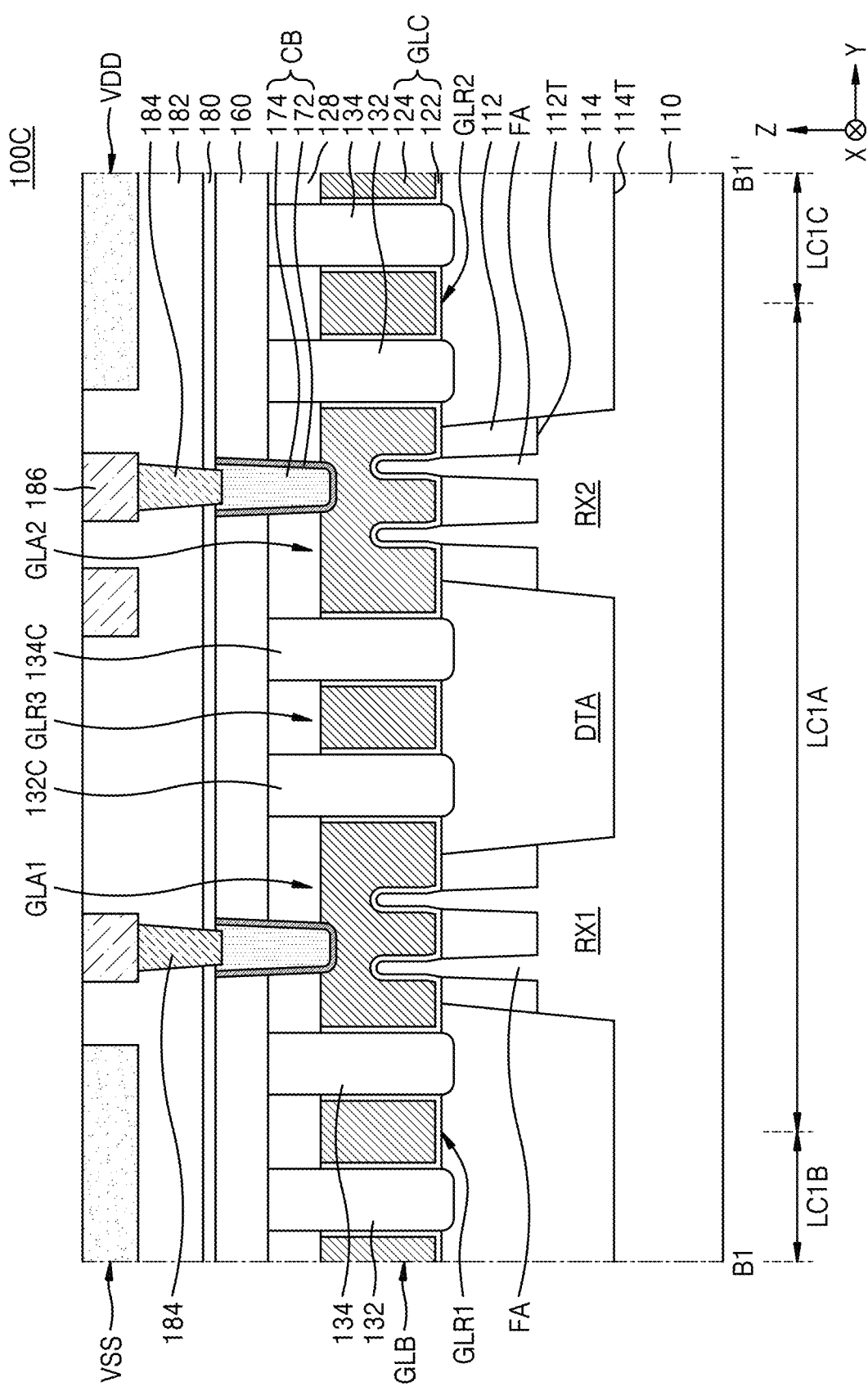
FIG. 9 is a cross-sectional view illustrating an integrated circuit device according to an example embodiment.

FIG. 9 is a cross-sectional view illustrating an integrated circuit device 100C according to an example embodiment. FIG. 9 is a cross-sectional view of a portion corresponding to line B1-B1' of FIG. 2. In FIG. 9, the same reference numerals as in FIGS. 1 to 8 denote the same components.

Referring to FIG. 9, the upper gate separation insulation layer 132C and the lower gate separation insulation layer 134C may be further disposed on the deep trench area DTA between the first active area RX1 and the second active area RX2. Accordingly, some of the first gate lines GLA (see FIG. 2) may be replaced with a first separation gate line GLA1 disposed on the first active area RX1 and a second separation gate line GLA2 disposed on the second active area RX2. A third cut gate line GLR3 may be disposed between the first separation gate line GLA1 and the second separation gate line GLA2.

In some embodiments, the third cut gate line GLR3 may be metal islands that are not electrically connected to the wiring layer 186. In other embodiments, a gate contact CB may be further formed on the third cut gate line GLR3, and the third cut gate line GLR3 may be connected to some nodes of the logic circuit block of the cell area LC through the gate contact CB.

Figure 10:
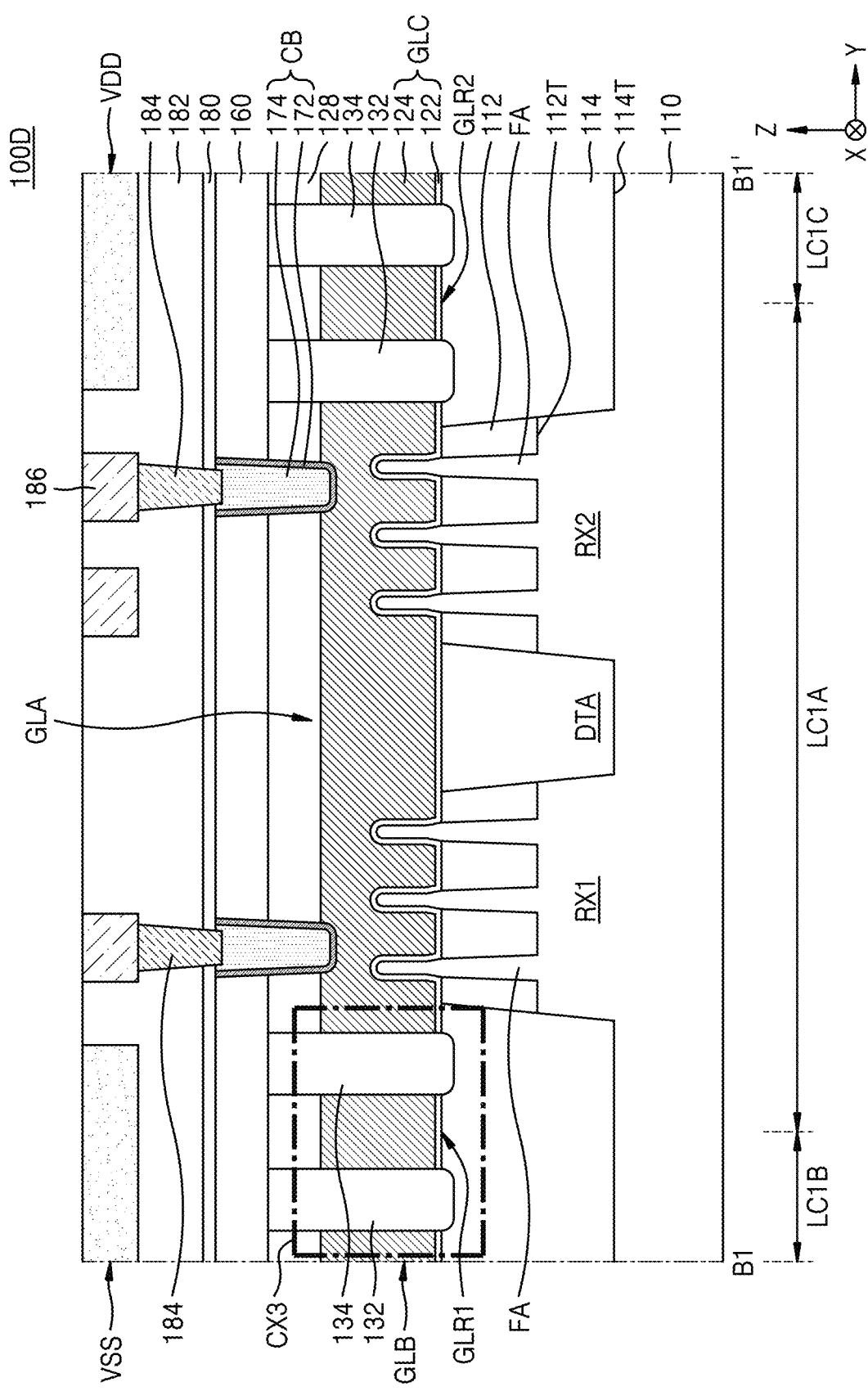
FIG. 10 is a cross-sectional view illustrating an integrated circuit device according to an example embodiment.
Figure 11:
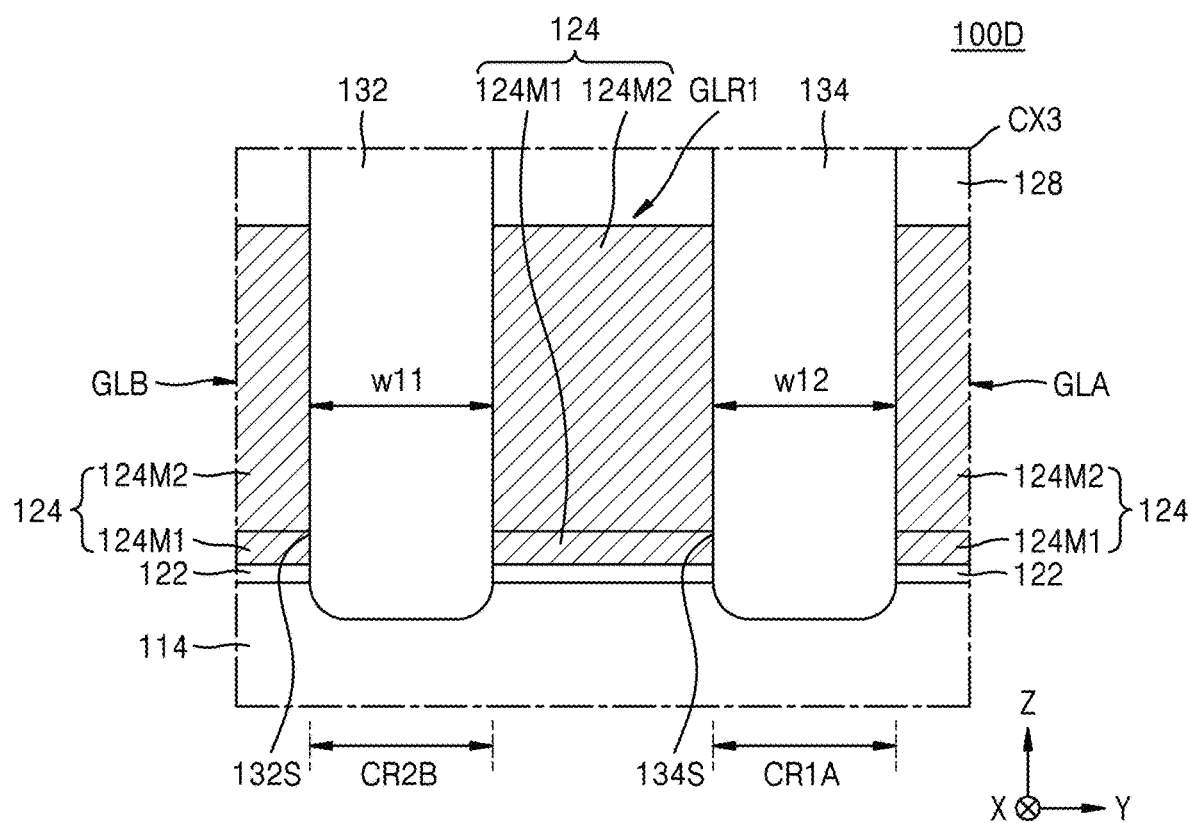
FIG. 11 is an enlarged cross-sectional view of a region CX2 of FIG. 10.

FIG. 10 is a cross-sectional view illustrating an integrated circuit device 100D according to an example embodiment. FIG. 11 is an enlarged cross-sectional view of a region CX2 of FIG. 10. In FIGS. 10 and 11, the same reference numerals as in FIGS. 1 to 9 denote the same components.

Referring to FIGS. 10 and 11, the lower gate cut area CR1A and the upper gate cut area CR2A may be formed after a replacement process of the gate line GL. For example, first, a gate line GL extending in the second direction Y is formed on the fin-type active area FA, the isolation layer 112, and the deep trench insulation layer 114, and a portion of the gate line GL is removed to form a lower gate cut area CR1A and an upper gate cut area CR2A, and the upper gate separation insulation layer 132 and the lower gate separation insulation layer 134 may be formed by filling an insulating material inside the lower gate cut area CR1A and the upper gate cut area CR2A.

The sidewall 132S of the upper gate separation insulation layer 132 may contact both the gate insulation layer 122 and the gate electrode 124, and the sidewall 134S of the lower gate separation insulation layer 134 may contact both the gate insulation layer 122 and the gate electrode 124. The first cut gate line GLR1 and the second cut gate line GLR2 may include a gate insulation layer 122 and a gate electrode 124 sequentially disposed on the deep trench insulation layer 114.

Figure 12:
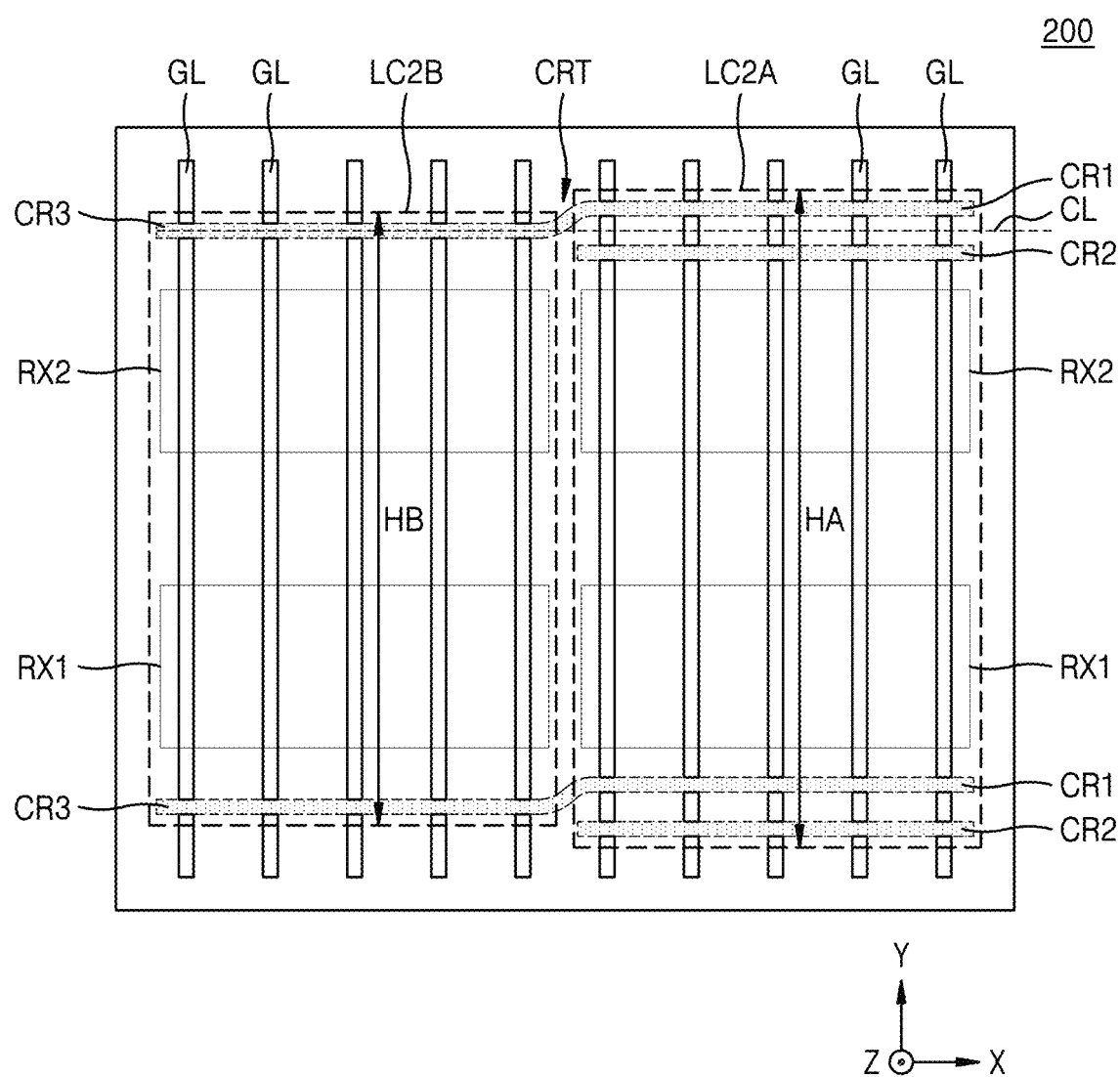
FIG. 12 is a layout diagram illustrating an integrated circuit device according to an example embodiment.

FIG. 12 is a layout diagram illustrating an integrated circuit device 200 according to an example embodiment. In FIG. 12, the same reference numerals as in FIGS. 1 to 11 denote the same components.

Referring to FIG. 12, a first cell area LC2A and a second cell area LC2B may be disposed adjacent to each other in the first direction X. In some examples, the first cell area LC2A may have a first height HA in the first direction X, and the second cell area LC2B may have a second height HB in the first direction X, and the second height HB may be different from the first height HA.

The first cell area LC2A may have similar characteristics to the plurality of cell areas LC described with reference to FIGS. 1 to 11. For example, the gate line GL extends in the second direction Y, and at both edge portions of the first cell area LC2A, the first gate cut area CR1 and the second gate cut area CR2 may be spaced apart by a desired and/or alternatively predetermined distance to extend in the first direction X. As described above with reference to FIGS. 1 to 11, first and second cut gate lines GLR1 and GLR2 may be disposed between the first gate cut area CR1 and the second gate cut area CR2. In addition, an upper gate separation insulation layer 132 and a lower gate separation insulation layer 134 may be disposed in the first gate cut area CR1 and the second gate cut area CR2, respectively.

In the second cell area LC2B, the third gate cut area CR3 may extend in the first direction X. The gate line GL in the second cell area LC2B may be separated from the gate line GL outside the second cell area LC2B by the third gate cut area CR3.

In a plan view, the third gate cut area CR3 may be connected to the first gate cut area CR1. For example, at the boundary between the first cell area LC2A and the second cell area LC2B, the first gate cut area CR1 may be connected to the third gate cut area CR3, and the connection part CRT between the first gate cut area CR1 and the third gate cut area CR3 may have a smooth curved shape. In some examples, the extension line in the first direction X of the third gate cut area CR3 may overlap the center line CL of the first gate cut area CR1 and the second gate cut area CR2, but embodiments of inventive concepts are not limited thereto.

In FIG. 12, a case where the first cell area LC2A and the second cell area LC2B have different heights HA and HB has been described, but embodiments of inventive concepts are not limited thereto. In other embodiments, the first cell area LC2A and the second cell area LC2B have the same height, but the distance between the cell boundary of the first cell area LC2A and the first active area RX1 may be different from the distance between the cell boundary of the second cell area LC2B and the first active area RX1. In other embodiments, a logic cell may be formed in the first cell area LC2A and an SRAM cell may be disposed in the second cell area LC2B. In other embodiments, the first cell area LC2A and the second cell area LC2B constitute parts of one logic circuit, but the electrical performance required for a portion formed in the first cell area LC2A may be different from the electrical performance required for a portion formed in the second cell area LC2B.

FIGS. 13A to 24C are cross-sectional views illustrating a method of manufacturing the integrated circuit device 100, according to an example embodiment. Specifically, FIGS. 13A, 14A, 15A, 16A, 19A, 20A, 21A, 22A, 23A, and 24A are cross-sectional views corresponding to line A1-A1' of FIG. 2, and FIGS. 13B, 14B, 15B, 16B, 17, 18, 19B, 20B, 21B, and 24B are cross-sectional views corresponding to line B1-B1' of FIG. 2, and FIGS. 14C, 22B, 23B, and 24C are cross-sectional views corresponding to line B2-B2' of FIG. 2.

Figure 13A:
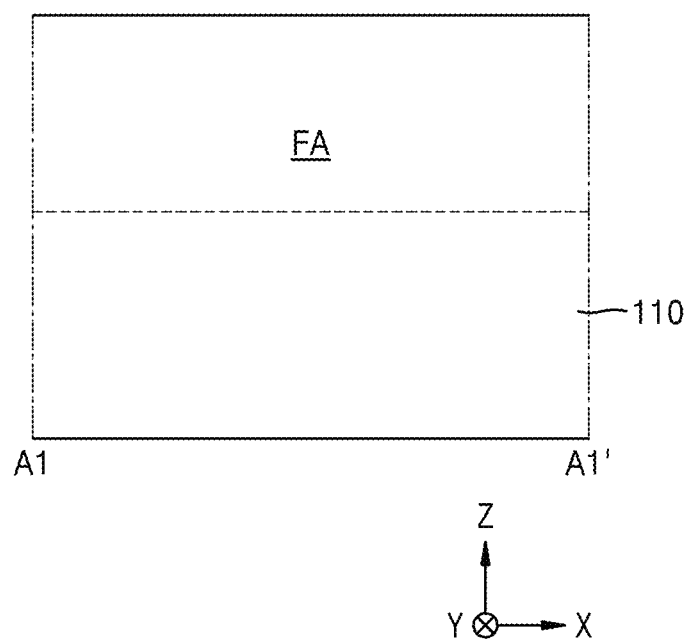
Figure 13B:
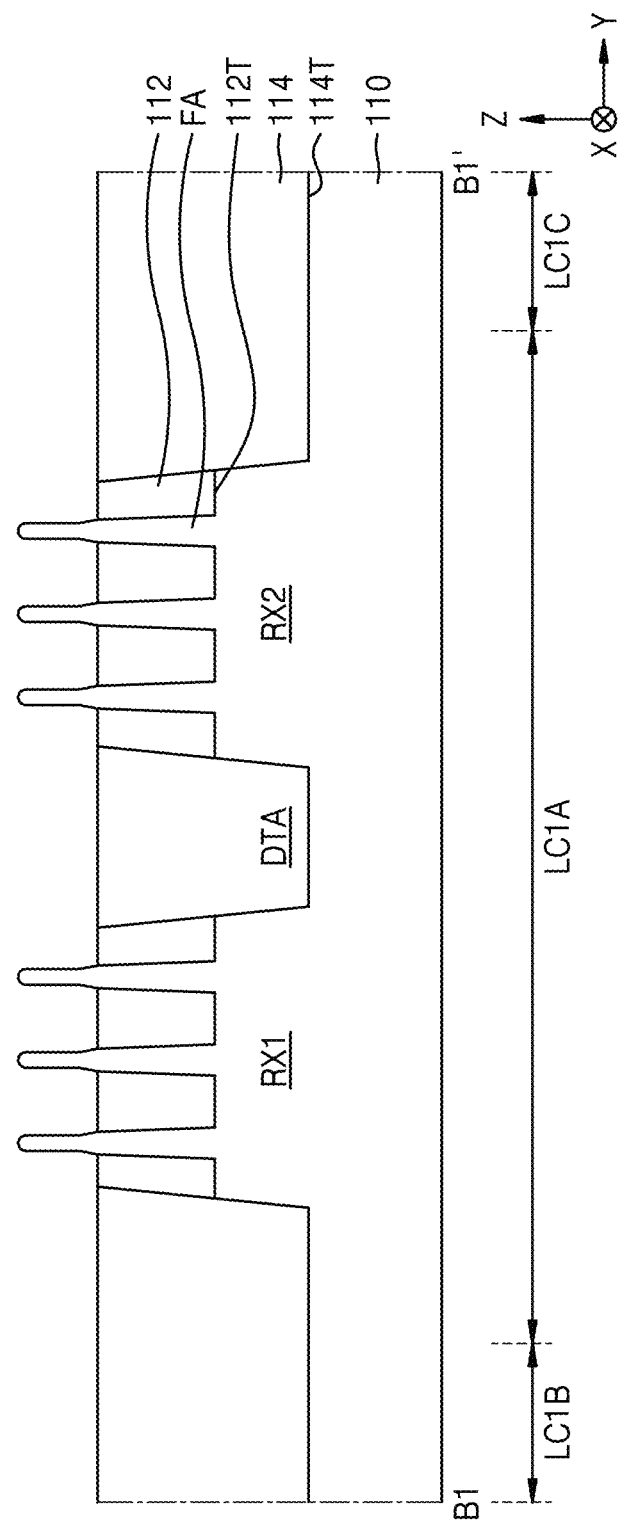

Referring to FIGS. 13A and 13B, a mask pattern (not shown) is formed on the upper surface of the substrate 110, and an isolation trench 112T may be formed by removing the substrate 110 by a desired and/or alternatively predetermined thickness using the mask pattern as an etching mask, thereby forming the fin-type active area FA.

Then, an isolation layer 112 covering both sidewalls of the fin-type active area FA may be formed on the substrate 110. Although not shown in the drawing, an interface layer (not shown) may be further formed between the isolation layer 112 and the fin-type active area FA to conformally cover the sidewall of the fin-type active area FA.

In an example embodiment, the isolation layer 112 may include an oxide film formed by a flowable chemical vapor deposition (FCVD) process or a spin coating process. For example, the isolation layer 112 may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ), but is not limited thereto.

Thereafter, a portion of the isolation layer 112 and a portion of the substrate 110 in the deep trench area DTA may be removed to form a deep trench 114T, and the inside of the deep trench 114T may be filled with an insulating material to form a deep trench insulation layer 114.

Thereafter, the upper portions of the isolation layer 112 and the deep trench insulation layer 114 may be removed by a desired and/or alternatively predetermined height by a recess process.

Figure 14A:
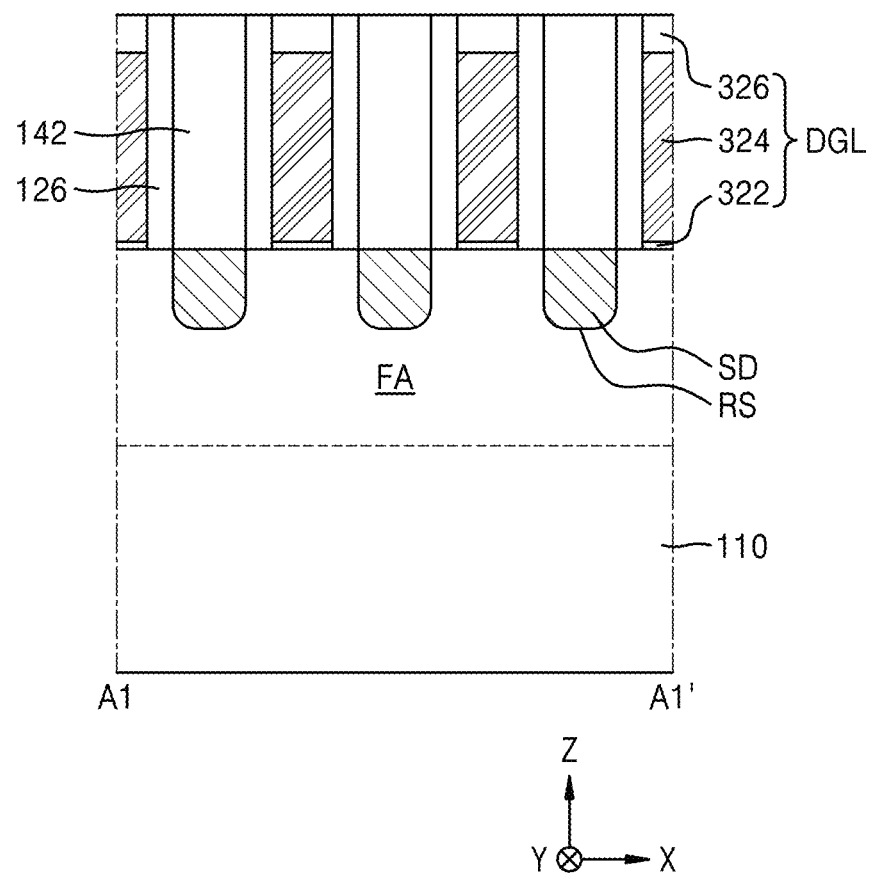
Figure 14B:
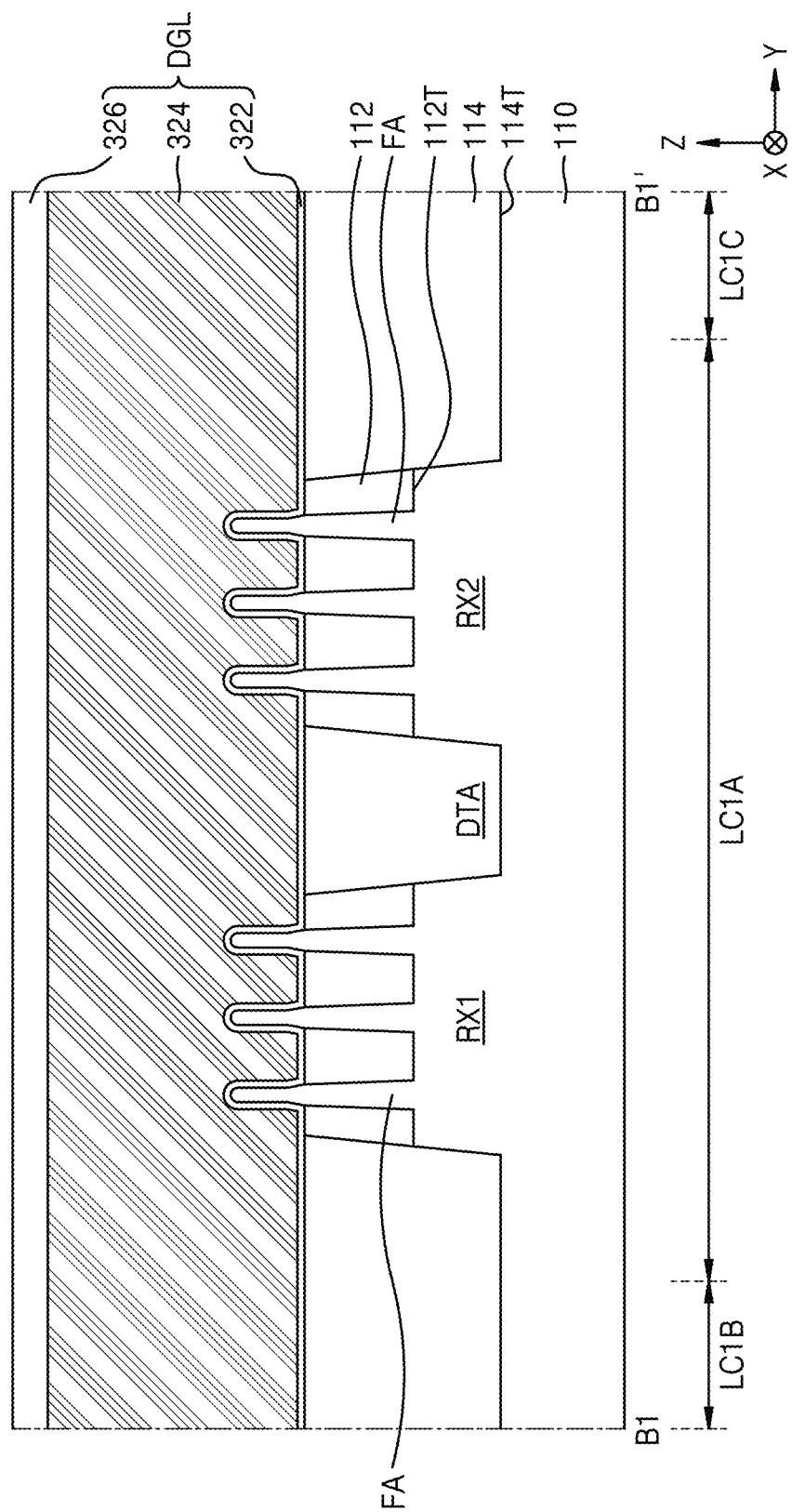
Figure 14C:
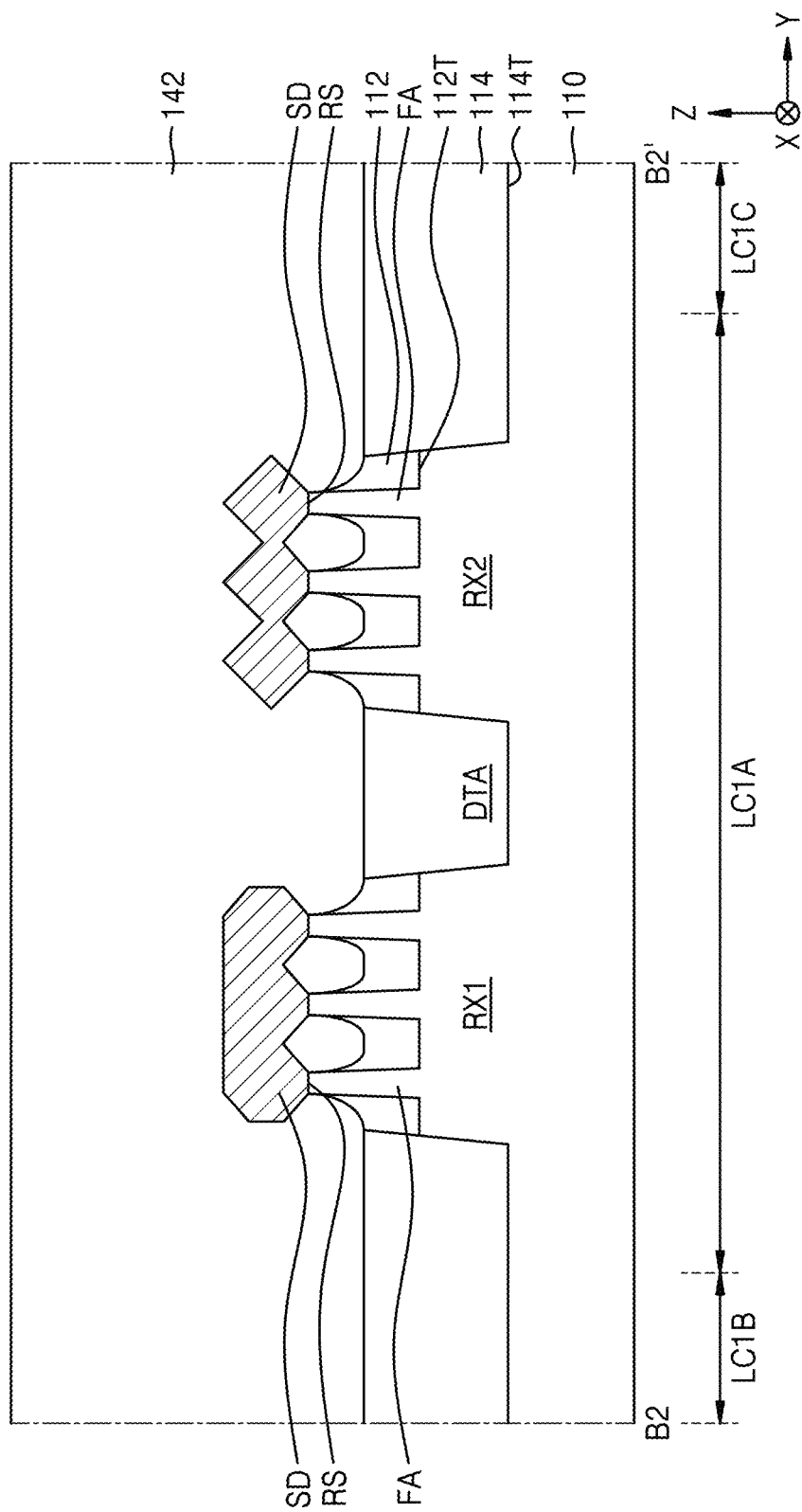

Referring to FIGS. 14A to 14C, after sequentially forming a sacrificial gate insulation layer (not shown), a sacrificial gate conductive layer (not shown), and a hard mask pattern 326 on the substrate 110, the sacrificial gate conductive layer and the sacrificial gate insulation layer are patterned using the hard mask pattern 326 as an etching mask, and accordingly, the sacrificial gate 324 and the sacrificial gate insulation layer pattern 322 may be formed. Here, the sacrificial gate insulation layer pattern 322, the sacrificial gate 324, and the hard mask pattern 326 are referred to as sacrificial gate lines DGL.

Thereafter, an insulation layer (not shown) covering the sacrificial gate line DGL is formed using an atomic layer deposition (ALD) process or a chemical vapor deposition (CVD) process, and a gate spacer 126 may be formed on a sidewall of the sacrificial gate line DGL by performing an anisotropic etching process on the insulation layer. The gate spacer 126 may include silicon nitride, but is not limited thereto.

The recess area RS may be formed by etching a portion of the fin-type active area FA on both sides of the sacrificial gate line DGL. Thereafter, a source/drain area SD may be formed in the recess area RS. In an example embodiment, the source/drain area SD may be formed by an epitaxy process using the sidewall of the fin-type active area FA exposed on the inner wall of the recess area RS and the upper surface of the substrate 110 as a seed layer. The epitaxy process may be vapor-phase epitaxy (VPE), a chemical vapor deposition (CVD) process such as ultra-high vacuum (UHV)-CVD, molecular beam epitaxy, or a combination thereof. In the epitaxy process, a liquid or gaseous precursor may be used as a precursor required to form the source/drain areas SD.

Thereafter, the inter-gate insulation layer 142 may be formed by forming an insulation layer (not shown) covering the sacrificial gate line DGL on the substrate 110, and planarizing the insulation layer so that the upper surface of the hard mask pattern 326 is exposed.

Figure 15A:
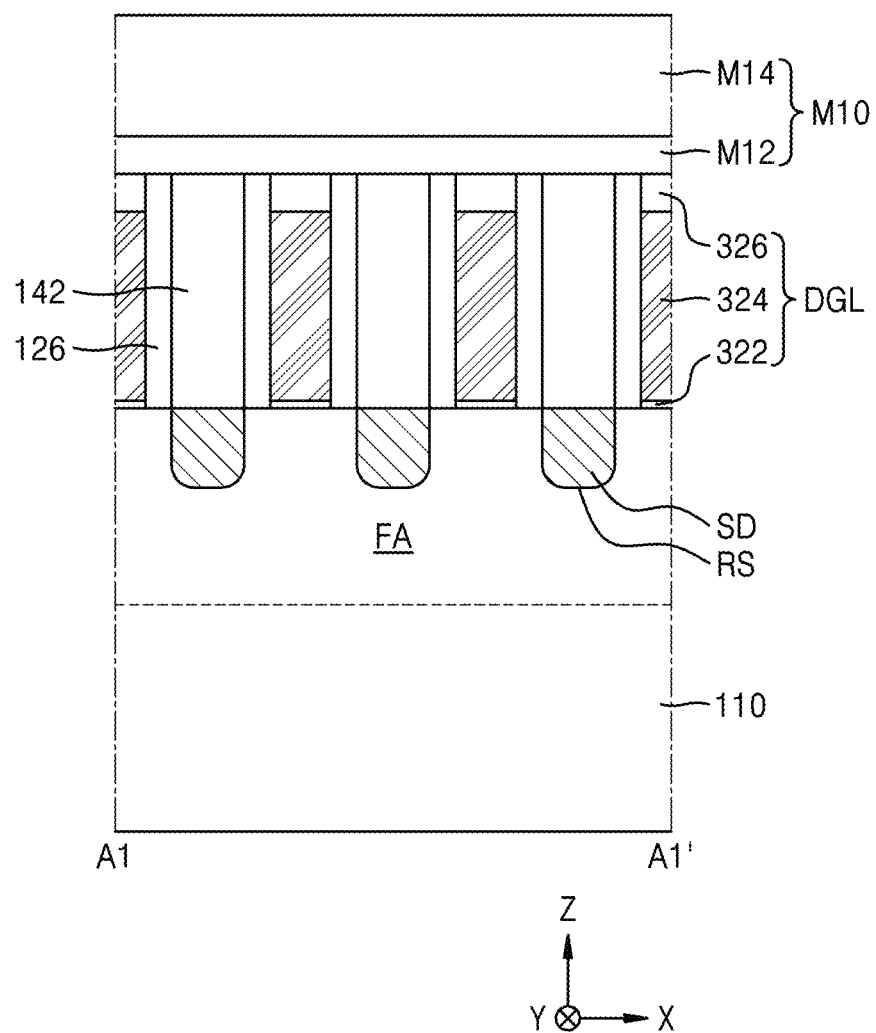
Figure 15B:
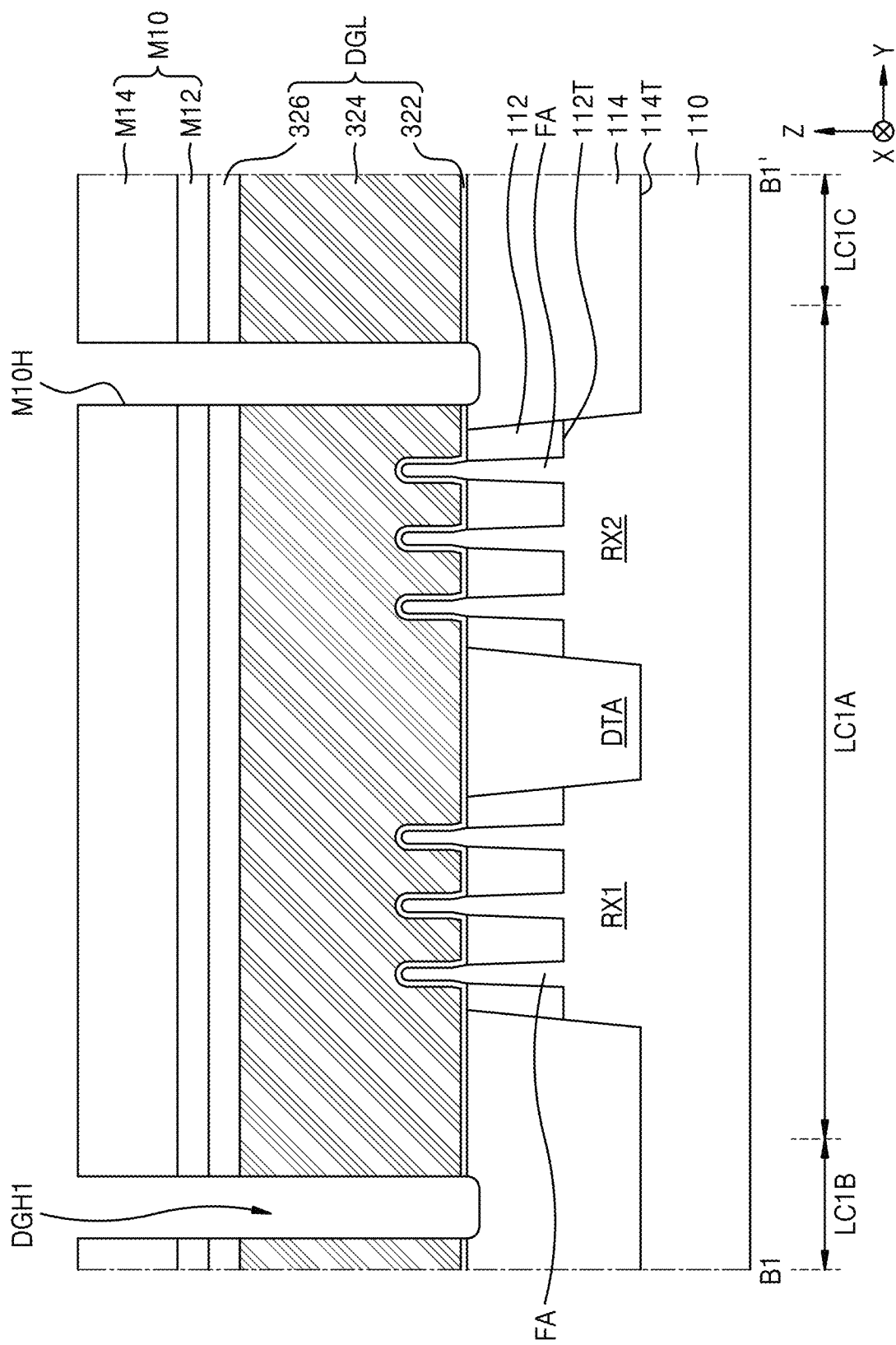

Referring to FIGS. 15A and 15B, a first mask pattern M10 may be formed on the sacrificial gate line DGL and the inter-gate insulation layer 142. The first mask pattern M10 may include a buffer layer M12 and a hard mask layer M14, and may include a first opening part M10H. The first opening part M10H may have a shape corresponding to the upper gate cut area CR2A described with reference to FIG. 2.

Thereafter, the first sacrificial gate contact hole DGH1 may be formed by removing a portion of the sacrificial gate line DGL exposed to the first opening part M10H using the first mask pattern M10 as an etching mask. The upper surface of the deep trench insulation layer 114 may be exposed at the bottom part of the first sacrificial gate contact hole DGH1, and the sacrificial gate line DGL may be separated into a plurality of portions by forming the first sacrificial gate contact hole DGH1.

In some example embodiments, the first opening part M10H may have a line shape extending in the first direction X, and the upper surface of the sacrificial gate line DGL and the upper surface of the inter-gate insulation layer 142 may be exposed together by the first opening part M10H. In this case, a portion of the sacrificial gate line DGL may be removed using an etching atmosphere having a relatively high etching rate for the sacrificial gate line DGL. In this etching atmosphere, the inter-gate insulation layer 142 may hardly be removed, or some thickness may be removed so that a recess having a relatively small height may be formed in the upper side of the inter-gate insulation layer 142.

For example, the first sacrificial gate contact hole DGH1 may have a first width w11 (refer to FIG. 6) in the second direction Y, and for example, the first width w11 may be in the range of about 10 nm to about 120 nm, but is not limited thereto.

Thereafter, the first mask pattern M10 may be removed, and a protective layer 330 filling the inside of the first sacrificial gate contact hole DGH1 may be formed.

Figure 16A:
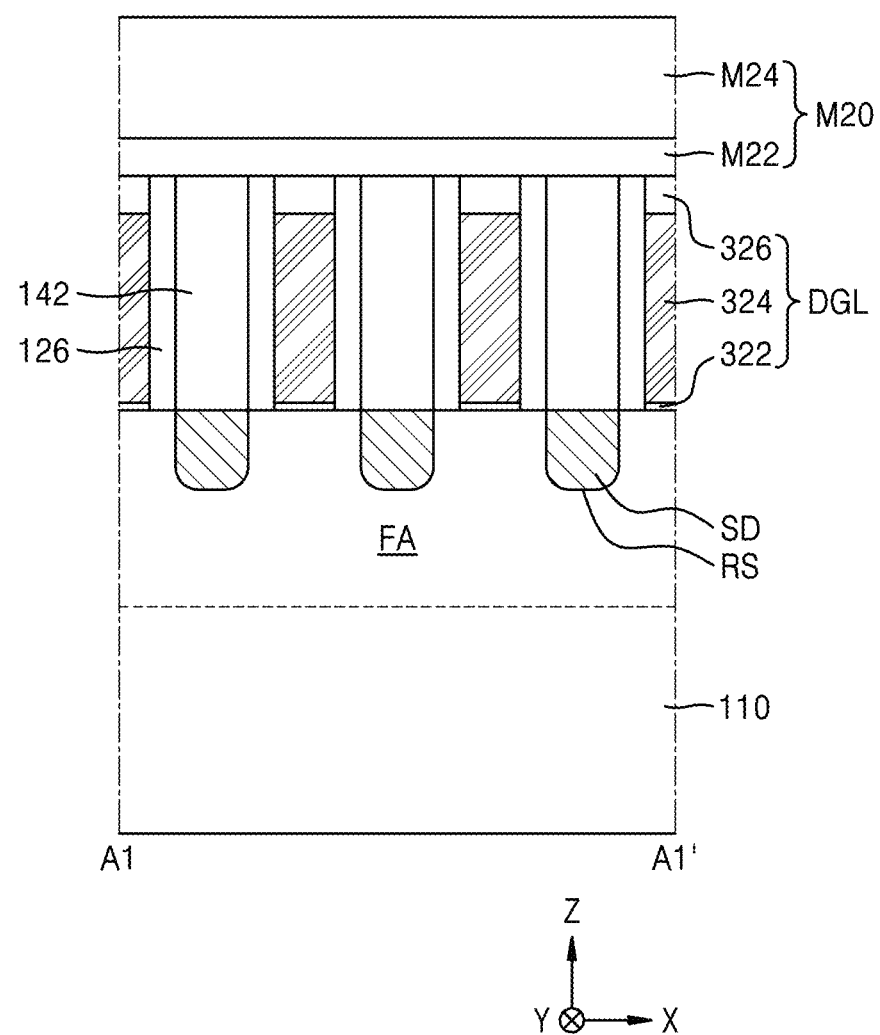

Referring to FIGS. 16A and 16B, a second mask pattern M20 may be formed on the sacrificial gate line DGL and the inter-gate insulation layer 142. The second mask pattern M20 may include a buffer layer M22 and a hard mask layer M24, and may include a second opening part M20H. The second opening part M20H may have a shape corresponding to the lower gate cut area CR1A described with reference to FIG. 2.

Thereafter, a second sacrificial gate contact hole DGH2 may be formed by removing a portion of the sacrificial gate line DGL exposed to the second opening part M20H using the second mask pattern M20 as an etching mask. The upper surface of the deep trench insulation layer 114 may be exposed on the bottom part of the second sacrificial gate contact hole DGH2, and the sacrificial gate line DGL may be separated into a plurality of portions by forming the second sacrificial gate contact hole DGH2.

In some example embodiments, the second opening part M20H may have a line shape extending in the first direction X, and the upper surface of the sacrificial gate line DGL and the upper surface of the inter-gate insulation layer 142 may be exposed together by the second opening part M20H. In this case, a portion of the sacrificial gate line DGL may be removed using an etching atmosphere having a relatively high etching rate for the sacrificial gate line DGL. In this etching atmosphere, the inter-gate insulation layer 142 may hardly be removed, or some thickness may be removed so that a recess having a relatively small height may be formed on the upper side of the inter-gate insulation layer 142.

For example, the second sacrificial gate contact hole DGH2 may have a first width w12 (refer to FIG. 6) in the second direction Y, and for example, the second width w12 may be in the range of about 10 nm to about 120 nm, but is not limited thereto.

Figure 17:
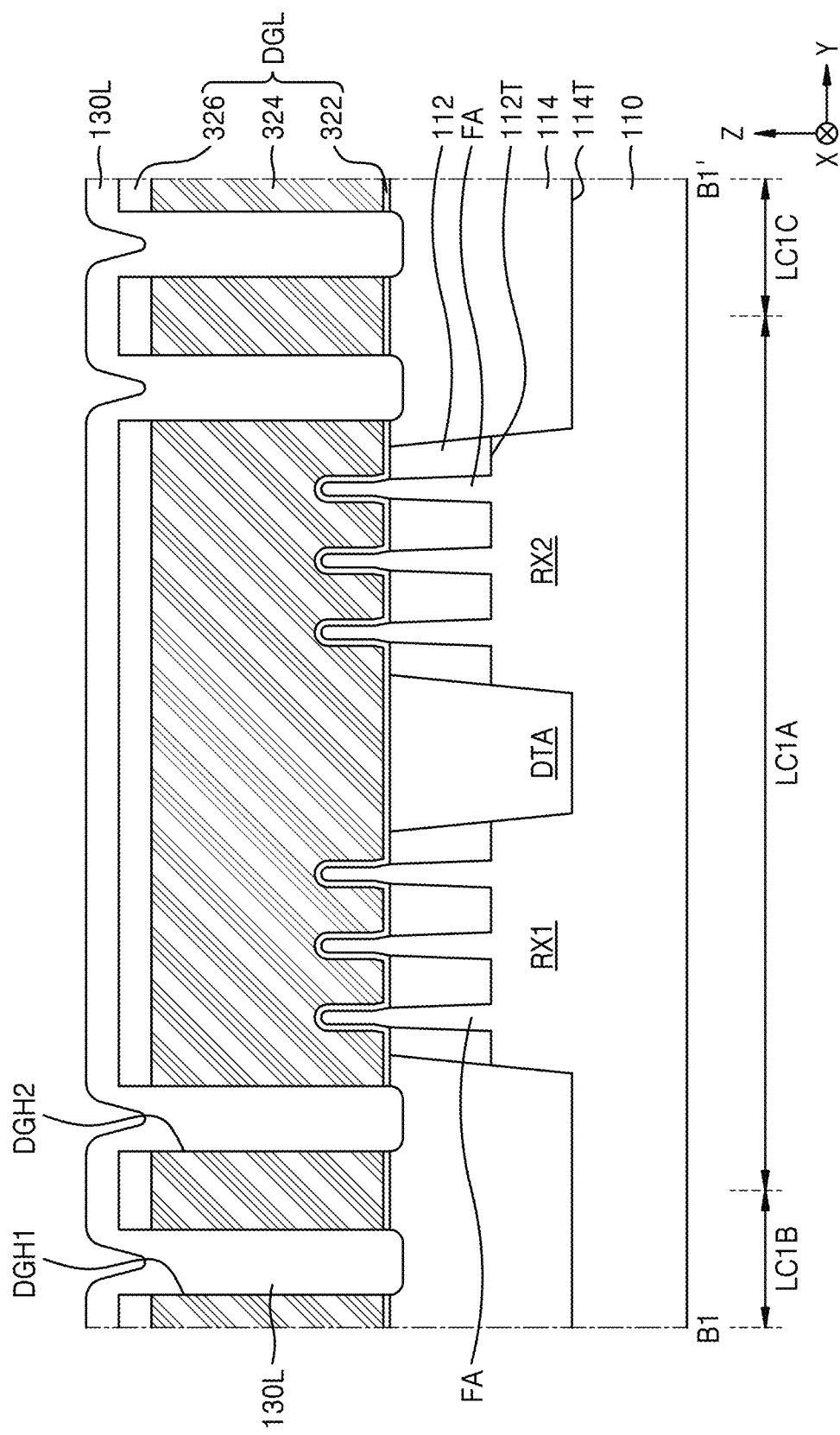

Referring to FIG. 17, the protective layer 330 filling the inside of the first sacrificial gate contact hole DGH1 may be removed.

Thereafter, the separation insulation layer 130L may be formed on the sacrificial gate line DGL and the inter-gate insulation layer 142 by using an insulating material. For example, the separation insulation layer 130L may completely fill the first sacrificial gate contact hole DGH1 and the second sacrificial gate contact hole DGH2, or completely fill the inside of the first sacrificial gate contact hole DGH1 and the second sacrificial gate contact hole DGH2 disposed at a level lower than the upper surface of the sacrificial gate 324 and may partially fill an entrance portion of the first sacrificial gate contact hole DGH1 and an entrance portion of the second sacrificial gate contact hole DGH2.

In the manufacturing method according to the comparative example, in the case of forming a single sacrificial gate contact hole so that the sacrificial gate contact hole has a relatively large width in the separation process of the sacrificial gate line DGL, the insulating material may not be completely filled inside the sacrificial gate contact hole, and if the sacrificial gate contact hole is not completely filled, a process failure may occur in a subsequent source/drain contact CA.

On the contrary, according to an example embodiment, because the first sacrificial gate contact hole DGH1 and the second sacrificial gate contact hole DGH2 having a relatively small width are formed to be apart from each other, an insulating material may be sufficiently filled in the first sacrificial gate contact hole DGH1 and the second sacrificial gate contact hole DGH2.

Figure 18:
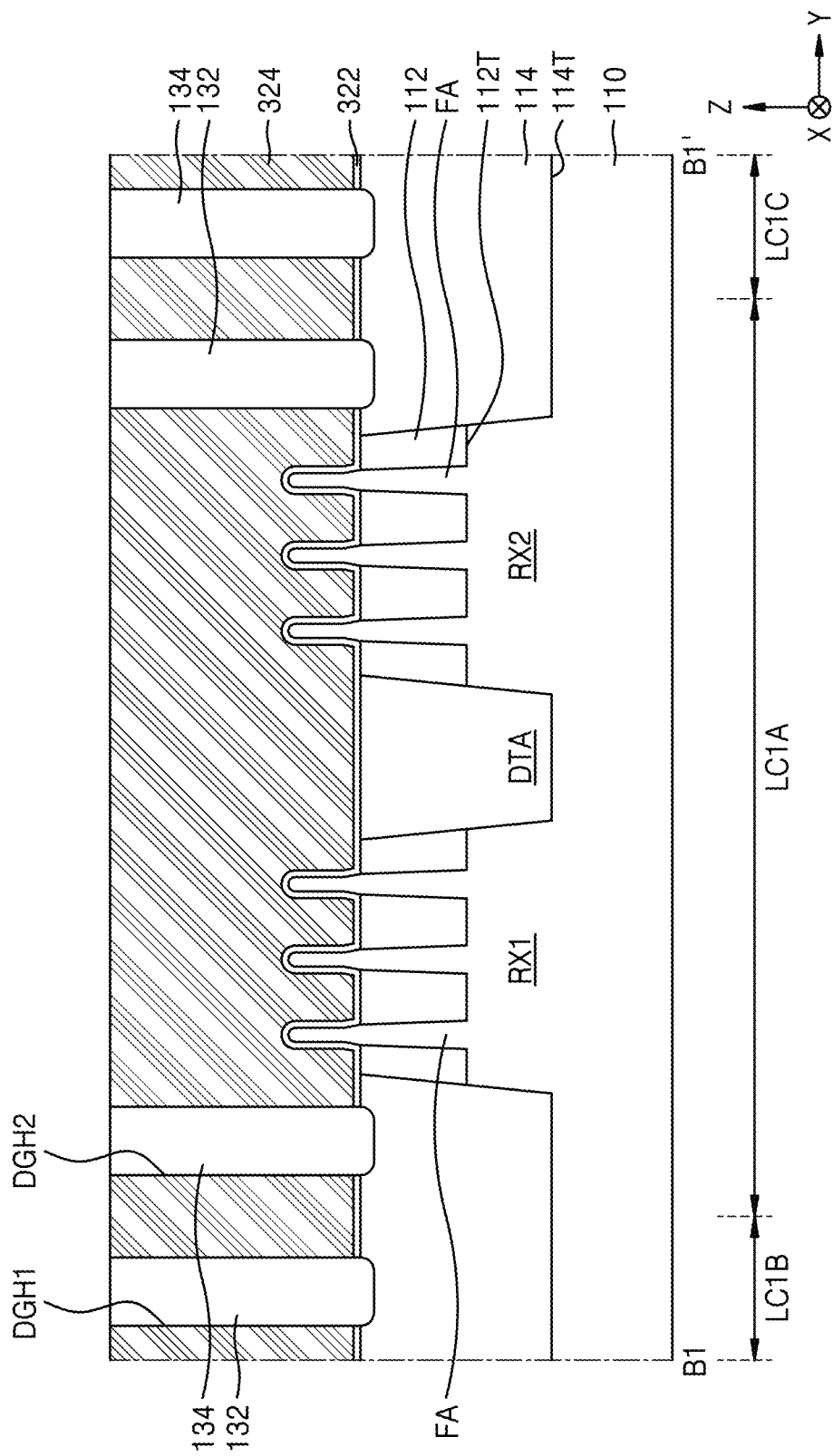

Referring to FIG. 18, the hard mask pattern 326 and the upper side of the separation insulation layer 130L may be removed so that the upper surface of the sacrificial gate 324 is exposed, and accordingly, an upper gate separation insulation layer 132 and a lower gate separation insulation layer 134 may be formed in the first sacrificial gate contact hole DGH1 and the second sacrificial gate contact hole DGH2, respectively.

The method has been described by way of example with reference to FIGS. 15A to 16B, in which the first sacrificial gate contact hole DGH1 is formed by removing the entire height (e.g., the sacrificial gate insulation layer pattern 322, the sacrificial gate 324, and the hard mask pattern 326) of the sacrificial gate line DGL exposed by the first opening part M10H of the first mask pattern M10, and thereafter, the entire height of the sacrificial gate line DGL exposed by the second opening part M20H of the second mask pattern M20 is removed so that the second sacrificial gate contact hole DGH2 is formed. However, according to other embodiments, only the portion of the hard mask pattern 326 exposed by the first opening part M10H of the first mask pattern M10 is removed, and thereafter, only the portion of the hard mask pattern 326 exposed by the second opening part M20H of the second mask pattern M20 is removed, and subsequently, portions of the sacrificial gate 324 that are not covered by the hard mask pattern 326 and portions of the sacrificial gate insulation layer pattern 322 that are not covered by the hard mask pattern 326 are removed together so that the first and second sacrificial gate contact holes DGH1 and DGH2 may be formed simultaneously. In this case, the process of forming the protective layer 330 may be omitted.

In addition, a method of forming the first sacrificial gate contact hole DGH1 and the second sacrificial gate contact hole DGH2 by two photolithographic patterning processes using the first mask pattern M10 and the second mask pattern M20 is described with reference to FIGS. 15A to 16B. However, the first sacrificial gate contact hole DGH1 and the second sacrificial gate contact hole DGH2 may be simultaneously formed by a mask pattern formed by exposure to other extreme ultraviolet rays. For example, by using a photoresist material, which is a photosensitive polymer material that has chemical properties that are changed by exposure to extreme ultraviolet rays having a wavelength of about 13.5 nm or less than about 11 nm, a mask pattern including both a first opening part corresponding to the first sacrificial gate contact hole DGH1 and a second opening part corresponding to the second sacrificial gate contact hole DGH2 may be formed. A first sacrificial gate contact hole DGH1 and a second sacrificial gate contact hole DGH2 may be simultaneously formed by using the mask pattern.

Figure 19A:
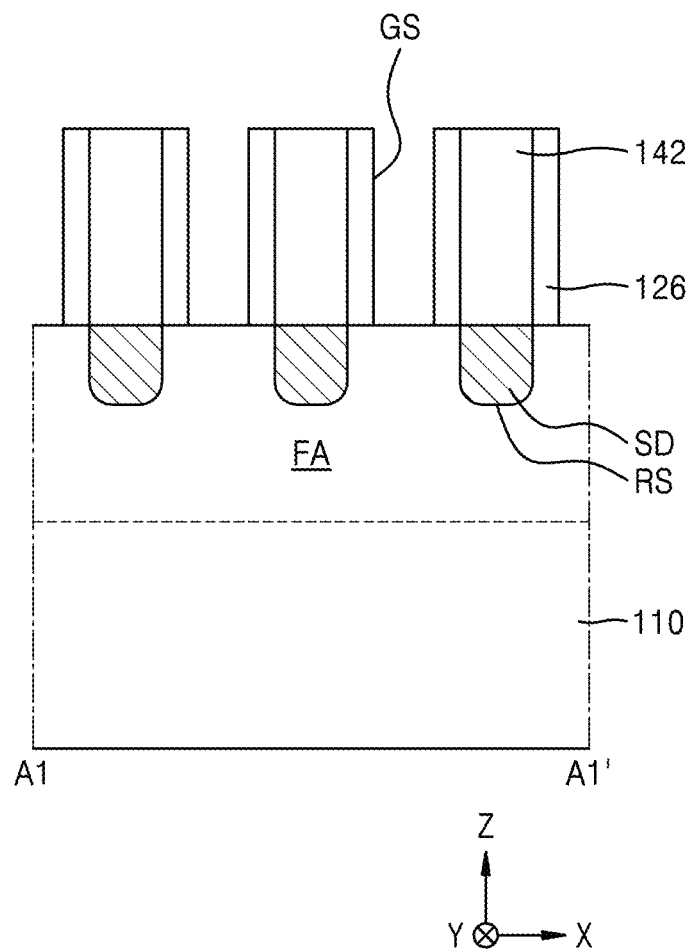
Figure 19B:
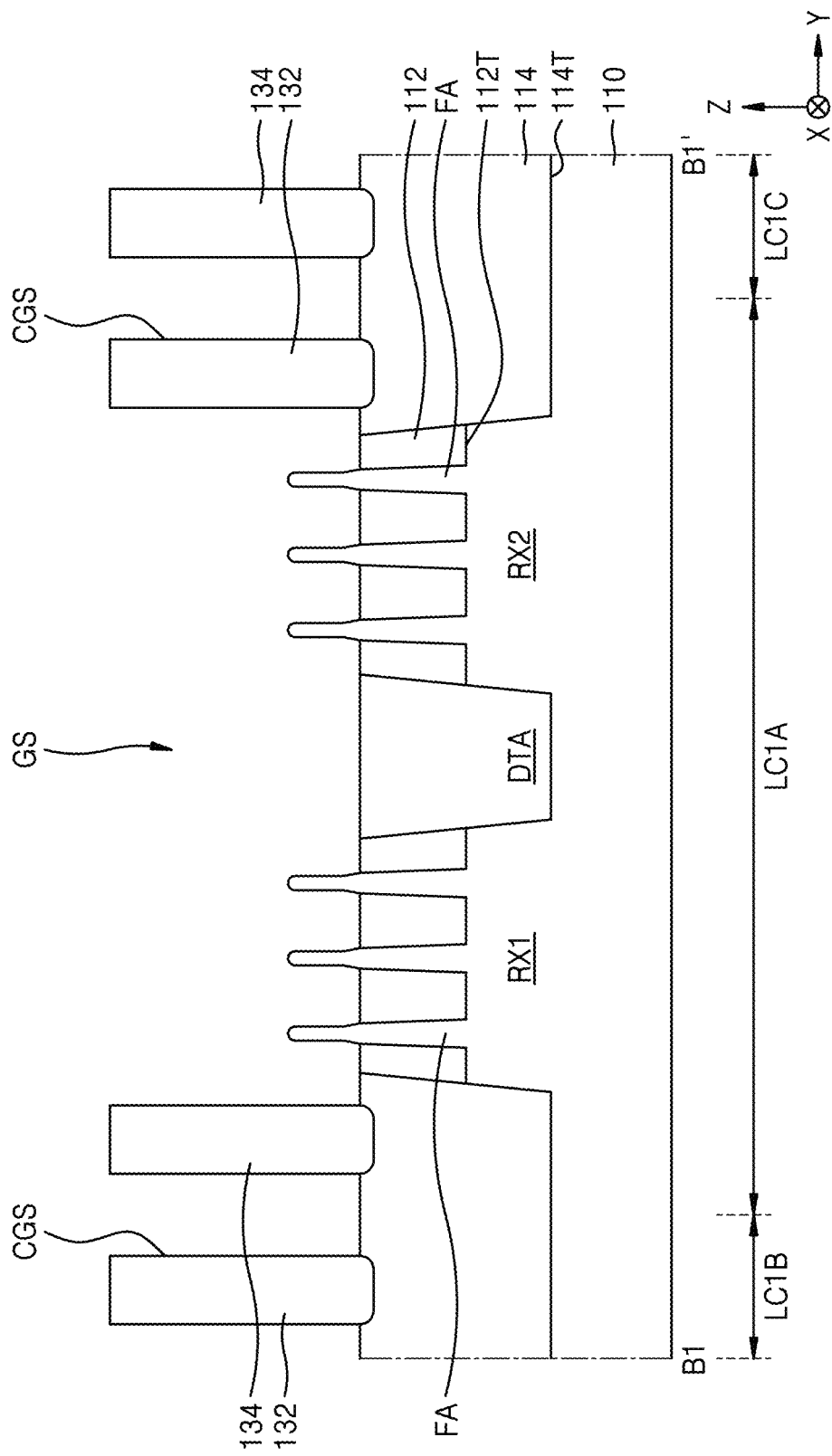

Referring to FIGS. 19A and 19B, the sacrificial gate 324 and the sacrificial gate insulation layer pattern 322 may be removed to form a gate space GS defined between sidewalls of the pair of gate spacers 126. The sacrificial gate 324 and the sacrificial gate insulation layer pattern 322 disposed between the upper gate separation insulation layer 132 and the lower gate separation insulation layer 134 are also removed together, so that a cut gate space CSG may be formed between the upper gate separation insulation layer 132 and the lower gate separation insulation layer 134.

Figure 20A:
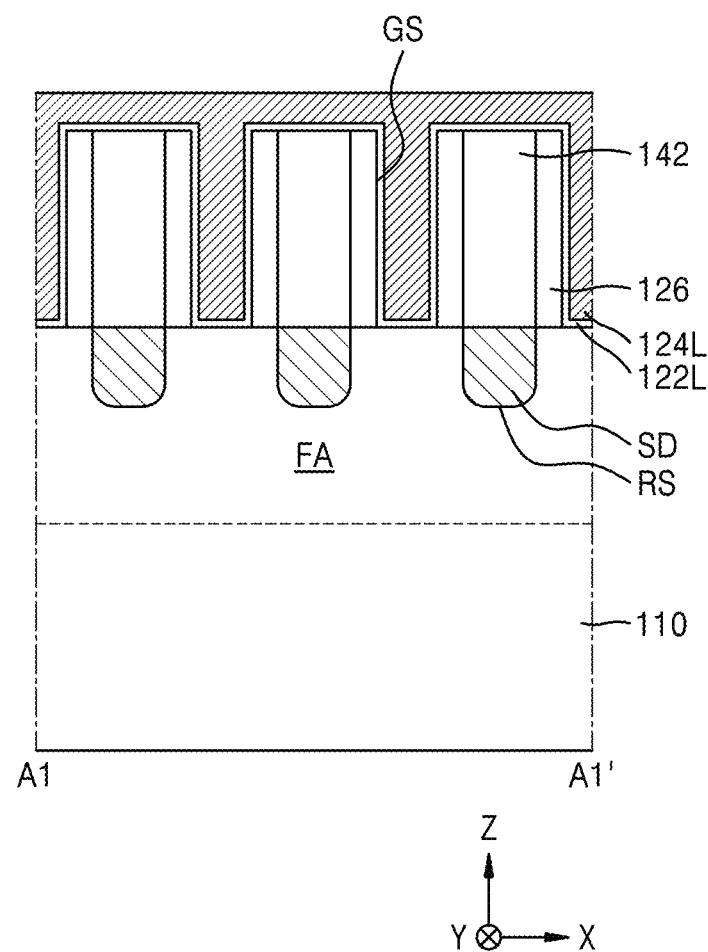
Figure 20B:
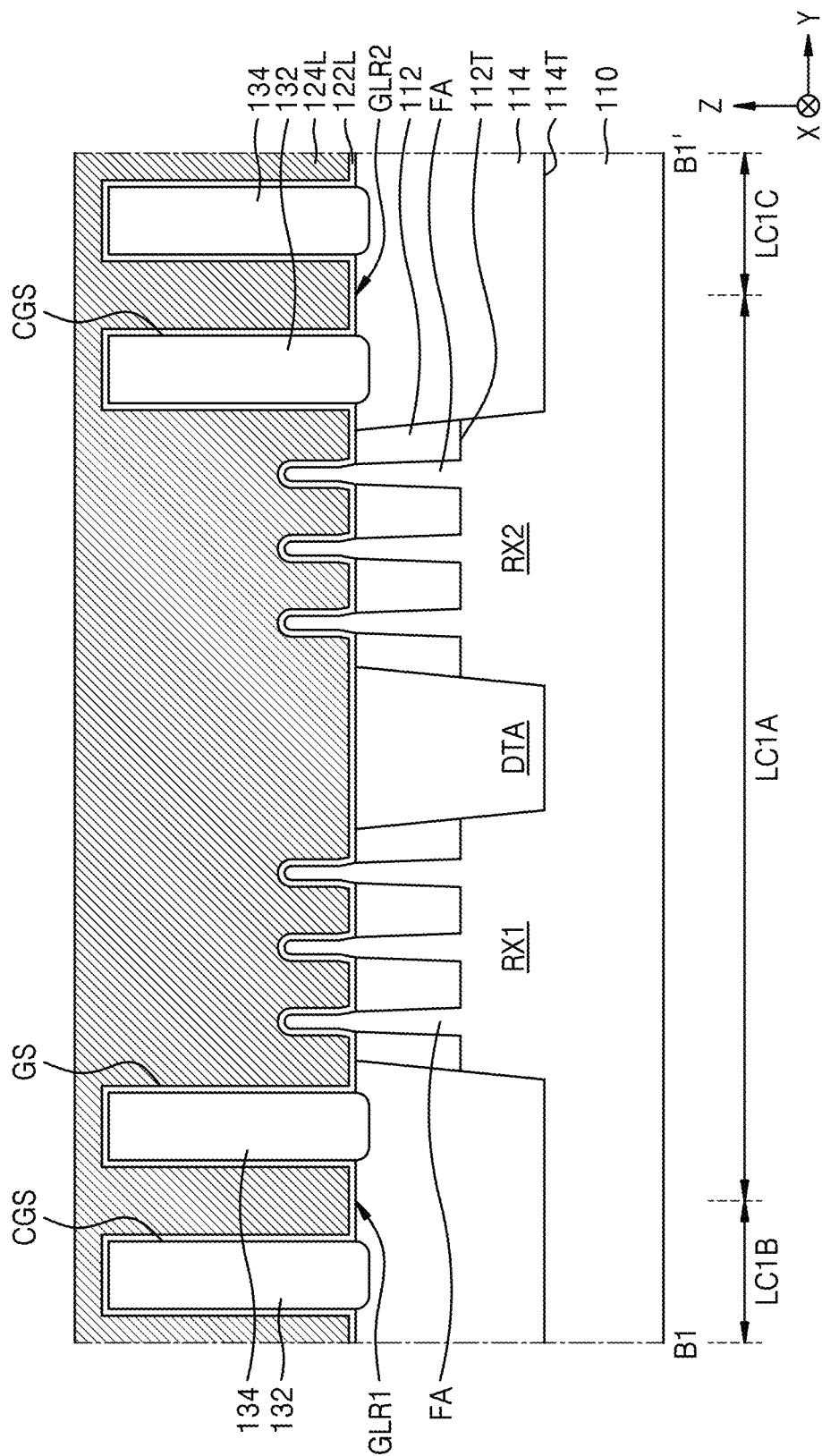

Referring to FIGS. 20A and 20B, an insulation layer 122L may be formed on the inner walls of the gate space GS and the cut gate space CSG. Thereafter, a conductive layer 124L filling the inside of the gate space GS may be formed on the insulation layer 122L. The conductive layer 124L may be formed by sequentially forming a work function metal containing layer 124M1 and a gap-fill metal film 124M2 as described with reference to FIGS. 1 to 6.

Figure 21A:
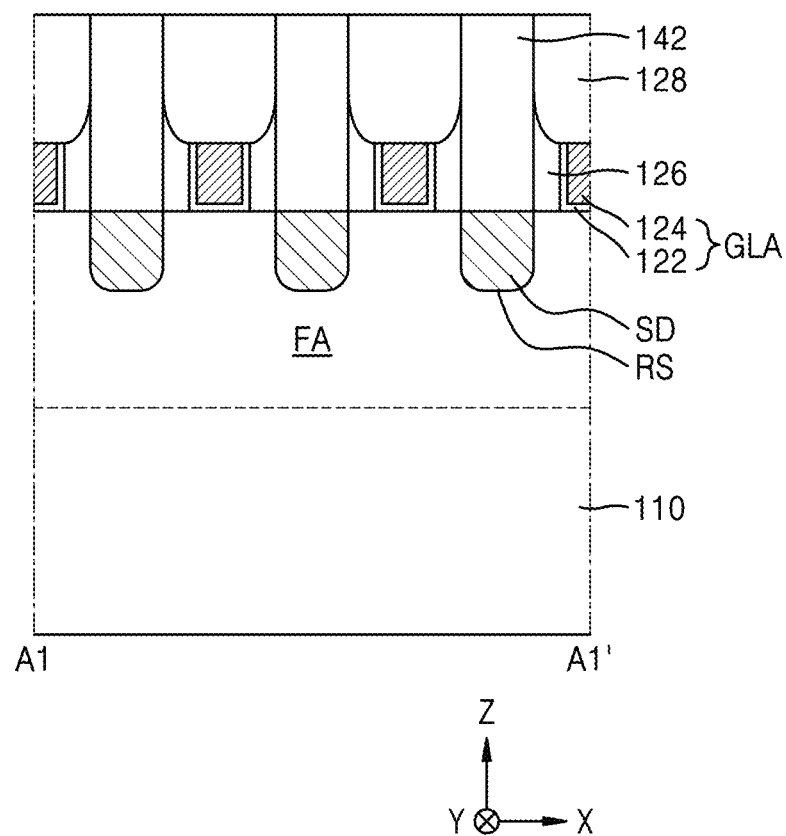
Figure 21B:
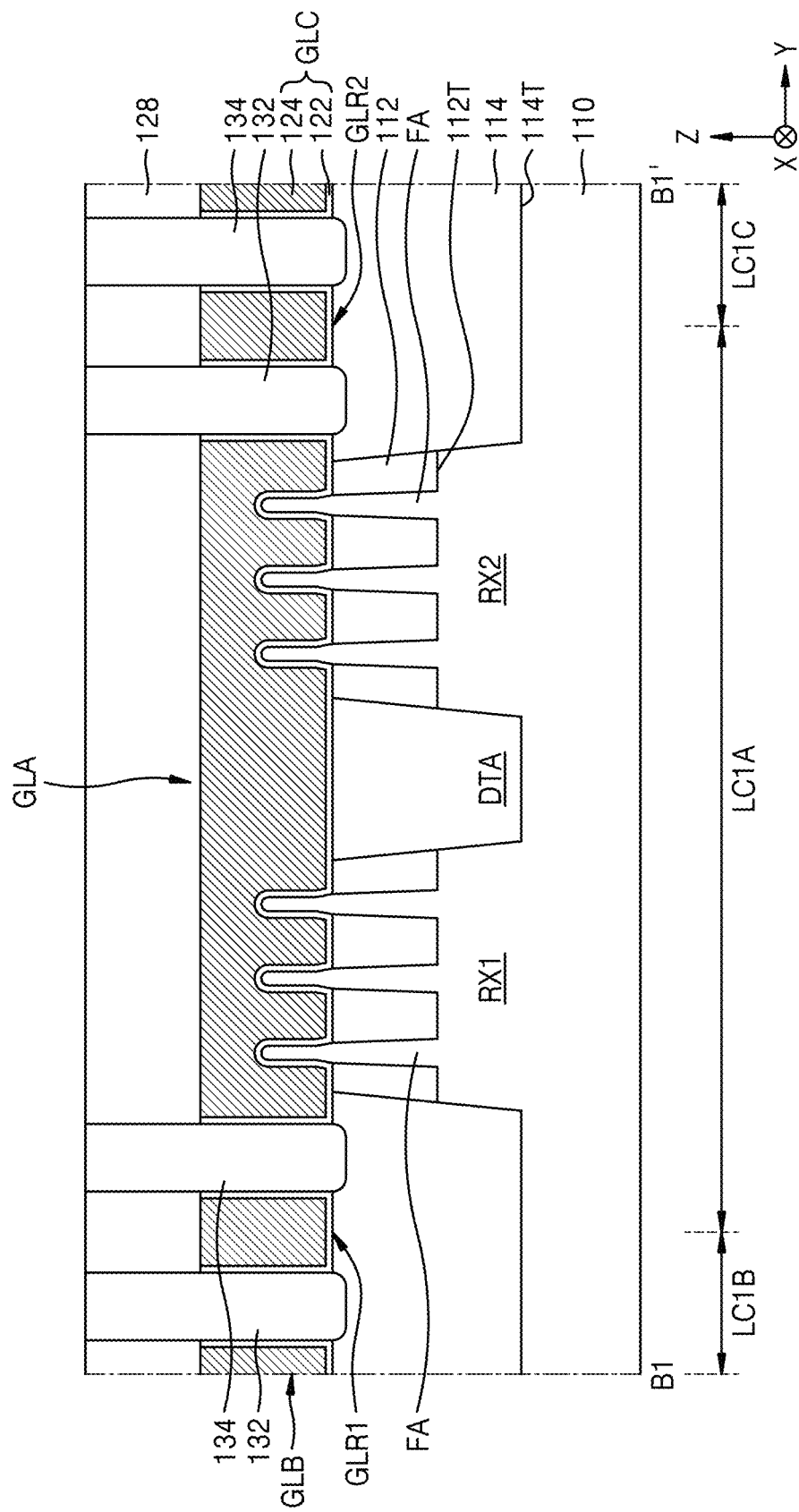

Referring to FIGS. 21A and 21B, the gate electrode 124 may be formed by planarizing the upper part of the conductive layer 124L so that the upper surface of the inter-gate insulation layer 142 is exposed. At this time, a part of the insulation layer 122L formed on the upper surface of the inter-gate insulation layer 142 may also be removed, and the gate insulation layer 122 may be formed.

Thereafter, the upper portion of the gate electrode 124 and the upper portion of the gate spacer 126 are etched back to laterally expand the upper entrance of the gate space GS and the cut gate space CSG, and form a gate capping layer 128 filling the upper entrances of the gate space GS and the cut gate space CSG.

Figure 22A:
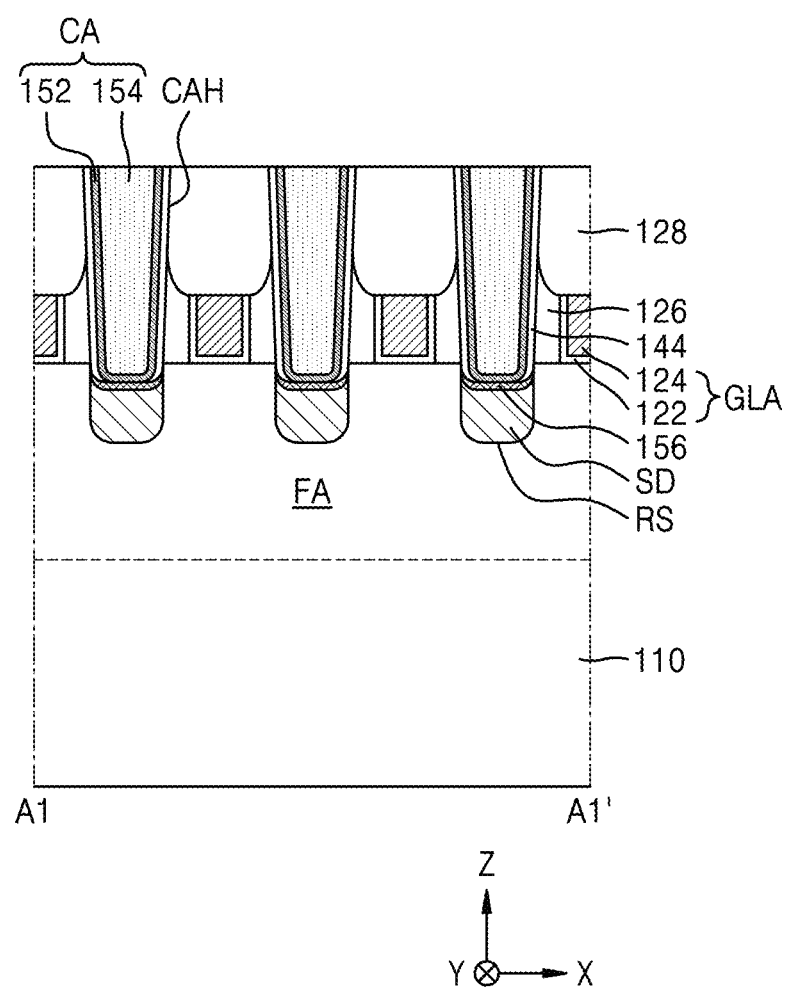
Figure 22B:
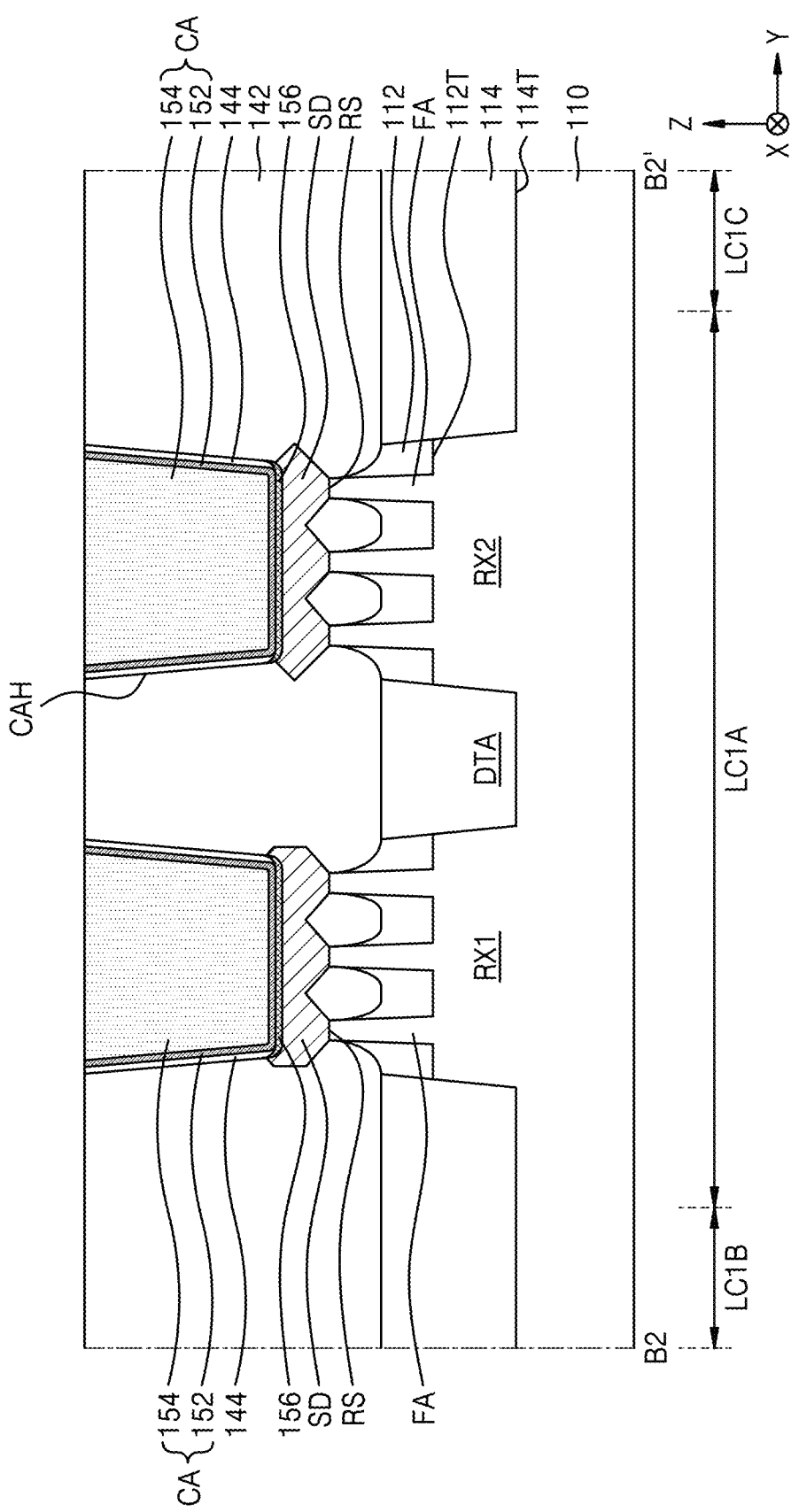

Referring to FIGS. 22A and 22B, a mask pattern (not shown) is formed on the gate capping layer 128 and the inter-gate insulation layer 142, and a portion of the inter-gate insulation layer 142 is etched using the mask pattern as an etching mask so that a source/drain contact hole CAH exposing the upper surface of the source/drain area SD may be formed.

Thereafter, a contact liner 144 may be formed on the gate capping layer 128 and the inter-gate insulation layer 142 to conformally cover the inner wall of the source/drain contact hole CAH, and a conductive barrier layer 152 may be formed on the inner wall of the source/drain contact hole CAH.

The resultant conductive barrier layer 152 is thermally treated to induce a reaction between a metal material included in the contact liner 144 and a semiconductor material included in the source/drain area SD, so that a metal silicide layer 156 may be formed to cover the upper surface of the source/drain area SD.

Thereafter, a metal film filling the inside of the source/drain contact hole CAH may be formed on the conductive barrier layer 152 and the contact plug 154 may be formed by planarizing the upper part of the metal film so that the upper surfaces of the inter-gate insulation layer 142 and the gate capping layer 128 are exposed.

Figure 23A:
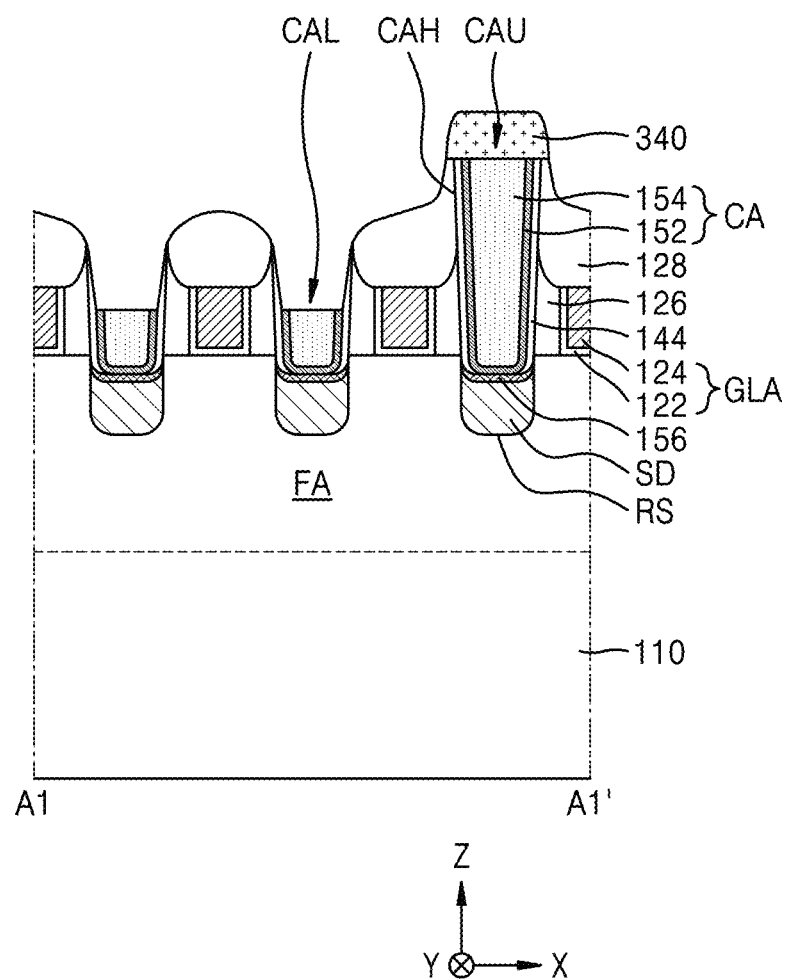
Figure 23B:
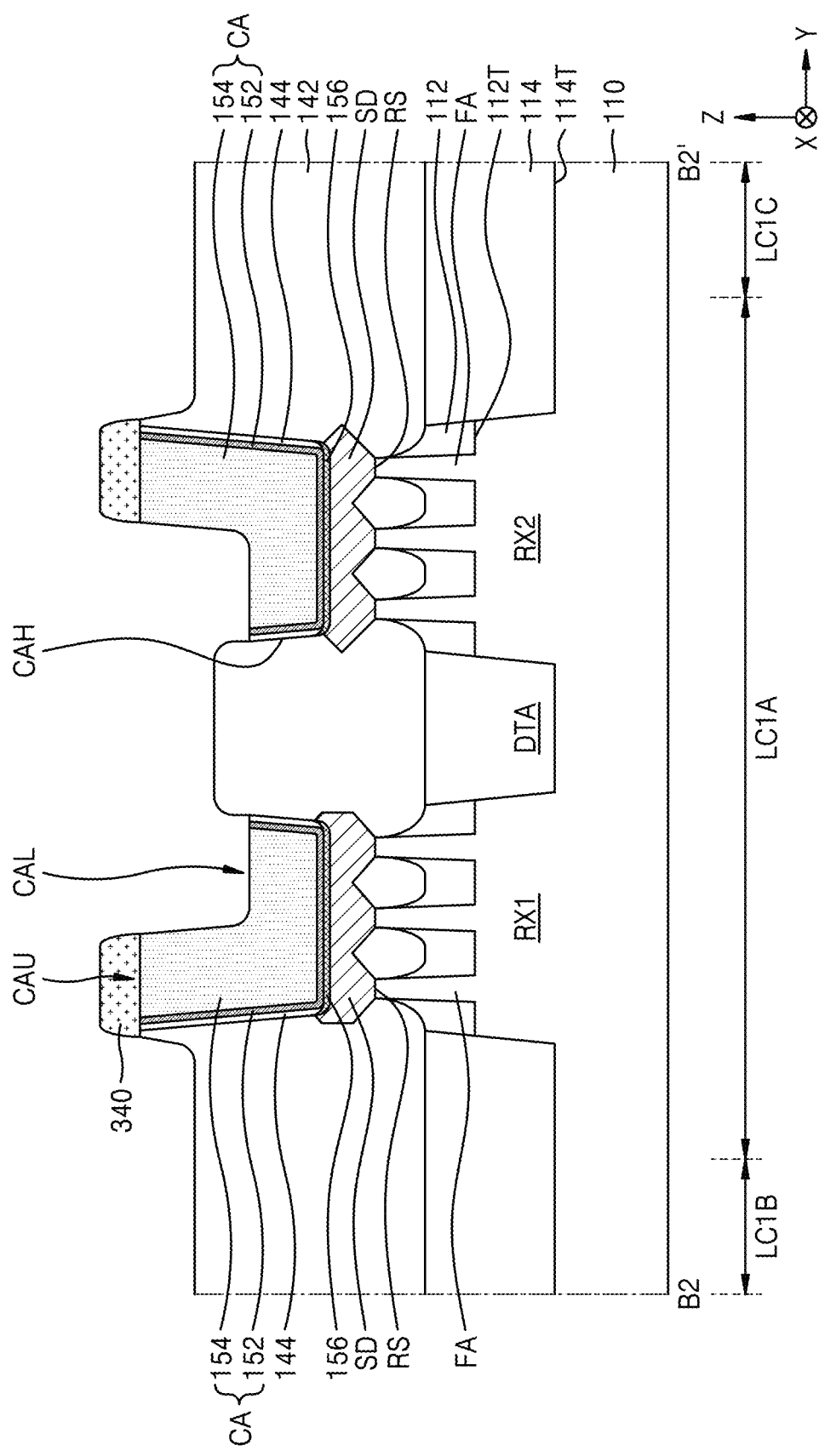

Referring to FIGS. 23A and 23B, a mask pattern 340 may be formed to cover a portion of the source/drain contact CA. In some embodiments, an etch stop layer (not shown) made of SiOC, SiN, or a combination thereof is formed on a portion of the source/drain contact CA, and a mask pattern 340 may be formed on the etch stop layer. The mask pattern 340 may be formed of a silicon oxide film, a spin on hardmask (SOH) film, a photoresist film, or a combination thereof, but is not limited thereto.

By using the mask pattern 340 as an etching mask, a recess process for etching the source/drain contact CA is performed, so that an upper side of a portion of the source/drain contact CA that is not covered by the mask pattern 340 may be removed. By the recess process, the source/drain contact CA may be formed to include a first portion CAU and a second portion CAL having different upper surface levels. The first part CAU is a portion that is covered by the mask pattern 340 so that the height is not decreased in the recess process, and the second portion CAL may correspond to a portion that has a height that is reduced by being exposed to an etching atmosphere in the recess process. A portion of the upper side of the gate capping layer 128 may be removed together by the recess process, so that the gate capping layer 128 may be formed to have a convex upper surface.

In addition, some heights of the inter-gate insulation layer 142 may be removed together in the recess process. However, in some embodiments, unlike that shown in FIG. 23B, the amount of etching of the inter-gate insulation layer 142 is insignificant, and the upper surface of the inter-gate insulation layer 142 may be disposed at a level that is substantially the same as or similar to the upper surface of the first portion CAU.

Figure 24A:
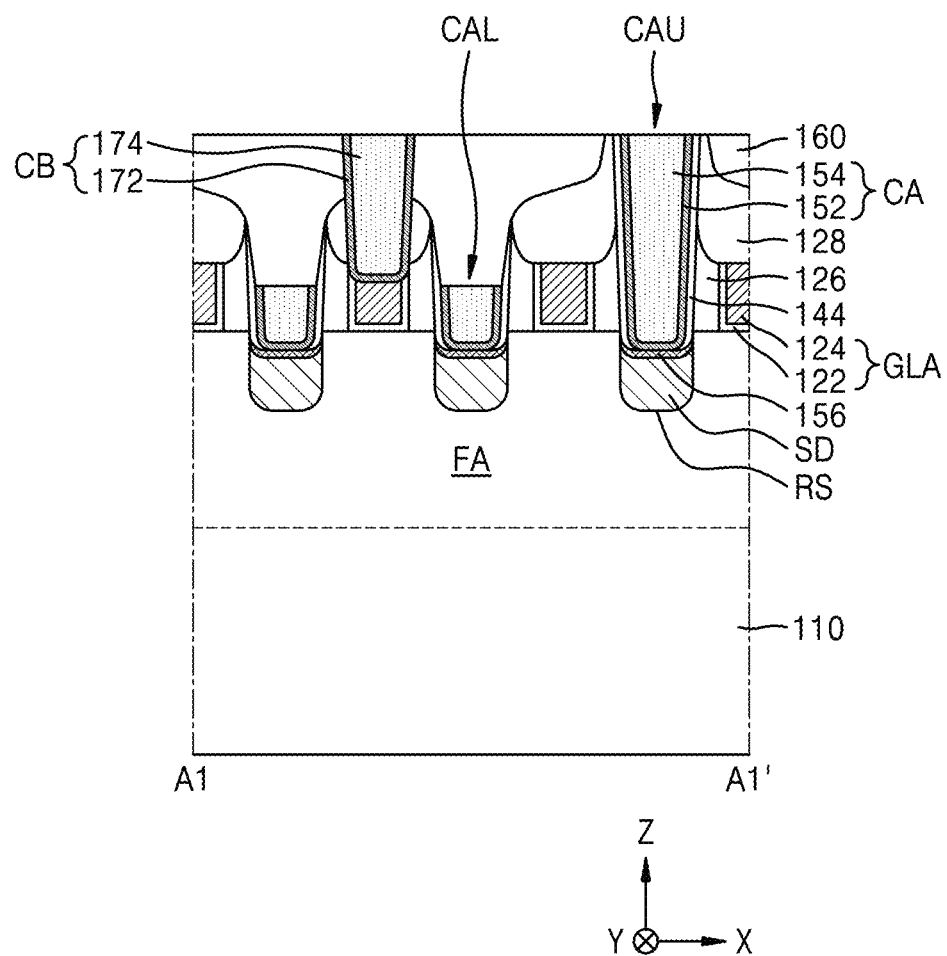
Figure 24B:
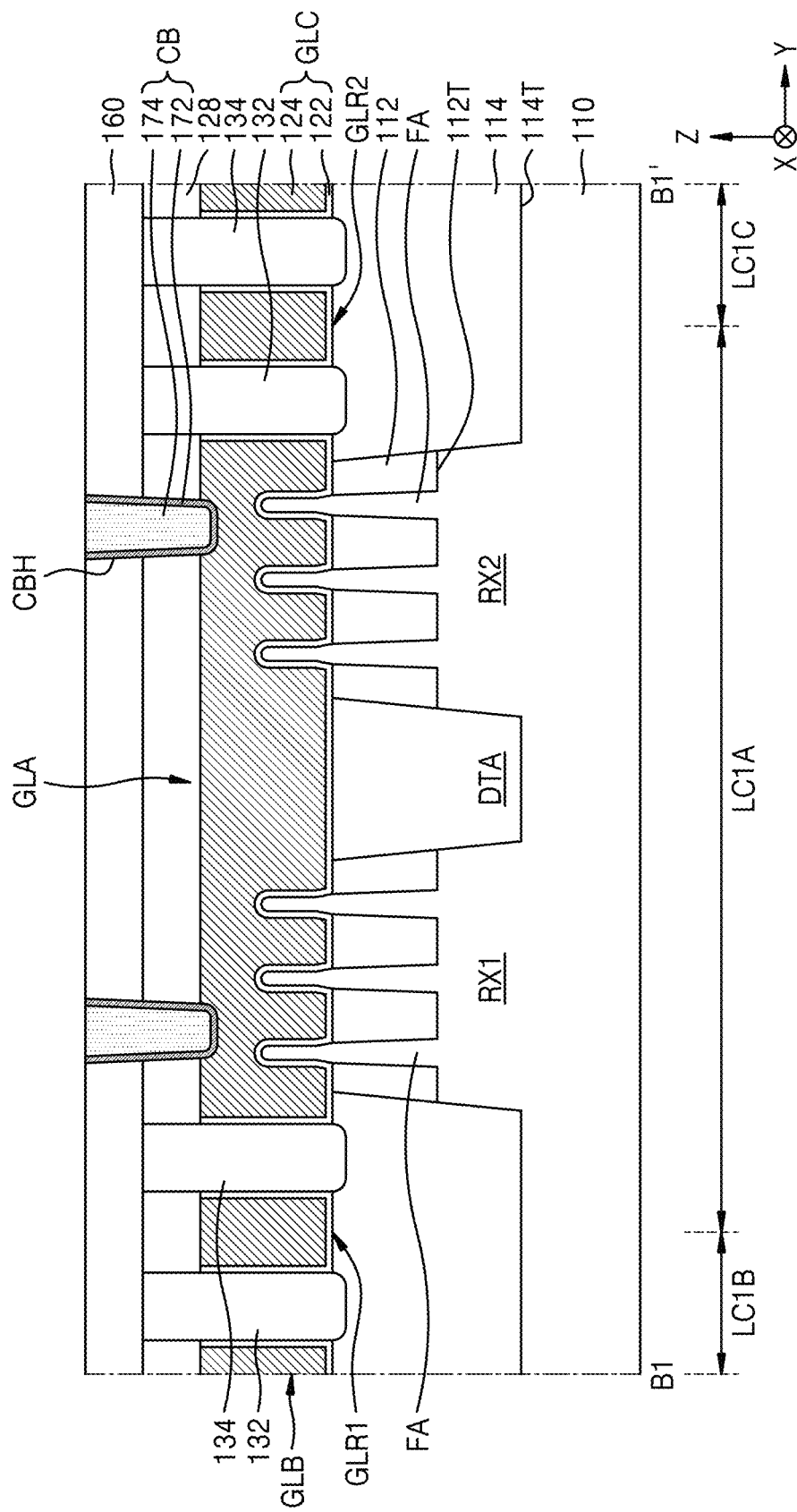
Figure 24C:
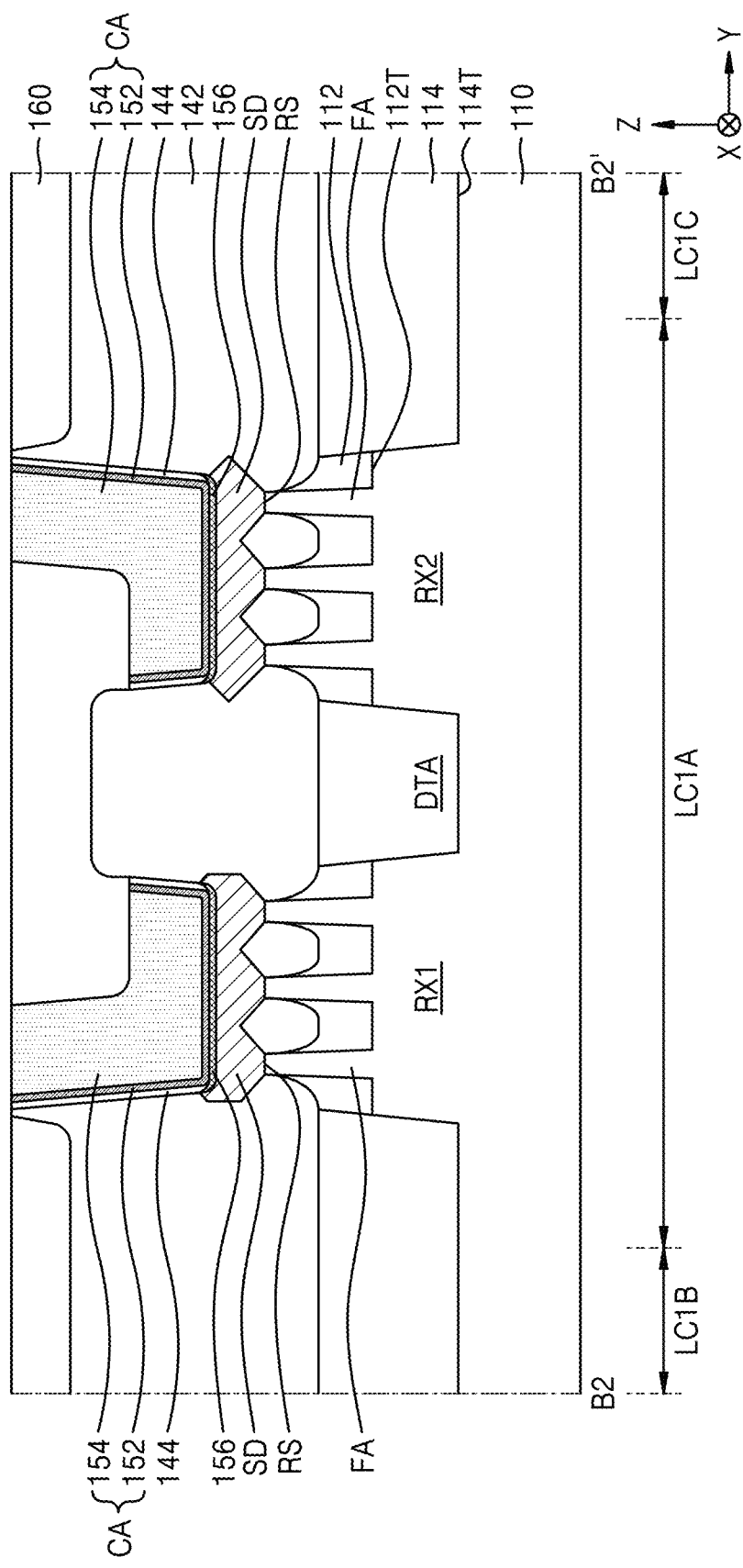

Referring to FIGS. 24A to 24C, a buried insulation layer 160 is formed on the exposed surfaces of the source/drain contact CA, the gate capping layer 128, and the inter-gate insulation layer 142, and the upper side of the buried insulation layer 160 may be planarized so that the first portion CAU of the source/drain contact CA and the first portion CAU of the source/drain contact CA are exposed. The buried insulation layer 160 may be formed to completely fill an upper side of the source/drain contact hole CAH exposed on the second part CAL of the source/drain contact CA.

Thereafter, a gate contact hole CBH exposing the upper surface of the gate electrode 124 may be formed through the buried insulation layer 160 and the gate capping layer 128, and a conductive barrier layer 172 may be formed on the inner wall of the gate contact hole CBH. A metal film filling the inside of the source/drain contact hole CAH may be formed on the conductive barrier layer 172 and a contact plug 174 may be formed in the gate contact hole CBH by planarizing the metal film so that the first portion CAU of the source/drain contact CA is exposed.

Thereafter, referring again to FIGS. 1 to 6, an etch stop layer 180 is formed on the buried insulation layer 160, the source/drain contact CA, and the gate contact CB, and an interlayer insulation film 182 is formed on the etch stop layer 180.

Thereafter, a via hole (not shown) penetrating the interlayer insulation film 182 and the etch stop layer 180 is formed, and the inside of the via hole is filled with a metal material, thereby forming the conductive via 184. A wiring layer 186 may be formed on the conductive via 184.

The integrated circuit device 100 is completed by the above-described manufacturing method. According to the above manufacturing method, a first sacrificial gate contact hole DGH1 and a second sacrificial gate contact hole DGH2 are sequentially formed, and an upper gate separation insulation layer 132 and a lower gate separation insulation layer 134 may be formed in the first sacrificial gate contact hole DGH1 and the second sacrificial gate contact hole DGH2. Accordingly, a relatively wide separation area (or a relatively large separation distance) between the first cell area LC1A and the second cell area LC1B may be secured. Therefore, the parasitic capacitance that may occur when the source/drain contact CA is arranged close to the first gate line GLA may be significantly reduced, and accordingly, the integrated circuit device 100 may have excellent electrical characteristics.

In addition, according to the above-described embodiments, the lower gate cut area CR1A having a relatively small width is formed between the first cut gate line GLR1 and the first gate line GLA, and the upper gate cut area CR2B having a relatively small width is formed between the first cut gate line GLR1 and the second gate line GLB. Accordingly, a filling failure (or insufficient filling) of the insulating material, which may occur when one gate isolation layer having a relatively wide width is formed to fill one gate separation area having a relatively large width between the first gate line GLA and the second gate line GLB, may be limited and/or prevented.

Meanwhile, in FIG. 17, it has been described that the separation insulation layer 130L filling both the first sacrificial gate contact hole DGH1 and the second sacrificial gate contact hole DGH2 is formed, but unlike this, the upper gate separation insulation layer 132B is formed in the first sacrificial gate contact hole DGH1 by using a first insulating material, and the lower gate separation insulation layer 134B may be formed in the second sacrificial gate contact hole DGH2 by using a second insulating material. In this case, the integrated circuit device 100B described with reference to FIG. 8 may be formed.

According to other example embodiments, after forming the gate electrode 124 and before forming the gate capping layer 128, portions of the gate electrode 124 and the gate insulation layer 122 are removed to form a lower gate cut area CR1A (see FIG. 2) and an upper gate cut area CR2A (see FIG. 2), and the upper gate separation insulation layer 132 and the lower gate separation insulation layer 134 may be formed by filling an insulating material inside the lower gate cut area CR1A and the upper gate cut area CR2A. In this case, the integrated circuit device 100D described with reference to FIGS. 10 and 11 may be formed.

While some embodiments of inventive concepts have been particularly shown and described, it will be understood that various changes in form and details may be made therein without departing from the spirit and scope of the following claims.

What is claimed is:

1. An integrated circuit device comprising:
    a substrate including a fin-type active area extending on the substrate in a first direction parallel to an upper surface of the substrate;
    a first gate line crossing the fin-type active area on the substrate and extending in a second direction perpendicular to the first direction;
    a cut gate line extending in the second direction and being spaced apart from the first gate line with a first gate cut area therebetween;
    a second gate line extending in the second direction and being spaced apart from the cut gate line with a second gate cut area therebetween; and
    a power wiring on the cut gate line, wherein
    the cut gate line overlaps a midpoint in the second direction between the first gate line and the second gate line, and
    a contiguous portion of the power wiring on the cut gate line overlaps the first gate cut area, the cut gate line, and the second gate cut area.

2. The integrated circuit device of claim 1, wherein the first gate line, the cut gate line, and the second gate line are disposed on a straight line.

3. The integrated circuit device of claim 1, further comprising:
    a first gate separation insulation layer in the first gate cut area and on the substrate; and
    a second gate separation insulation layer disposed in the second gate cut area and on the substrate.

4. The integrated circuit device of claim 3, wherein
    the first gate separation insulation layer has a first width in the second direction,
    the second gate separation insulation layer has a second width in the second direction, and
    the second width is different from the first width.

5. The integrated circuit device of claim 3, wherein
    the first gate separation insulation layer comprises a first insulating material,
    the second gate separation insulation layer comprises a second insulating material.

6. The integrated circuit device of claim 3, wherein
    the first gate line comprises a gate insulation layer, a first gate electrode, and a second gate electrode, and
    the gate insulation layer contacts a sidewall of the first gate separation insulation layer.

7. The integrated circuit device of claim 3, wherein
    the first gate line comprises a first gate insulation layer, a first gate electrode, a second gate insulation layer, and a second gate electrode,
    the first gate insulation layer is between the first gate electrode and the first gate separation insulation layer,
    the first gate insulation layer contacts a first sidewall of the first gate separation insulation layer, and the second gate insulation layer contacts a second sidewall of the first gate separation insulation layer, and
    the first sidewall of the first gate separation insulation layer is opposite the second sidewall of the first gate separation insulation layer.

8. The integrated circuit device of claim 1, further comprising:
    a gate contact on the first gate line;
    a source/drain area adjacent to a sidewall of the first gate line on the fin-type active area; and
    a source/drain contact connected to the source/drain area, wherein
    the source/drain contact includes a first portion and a second portion, and
    an upper surface of the second portion is at a level lower than an upper surface of the first portion, and
    a width of the first portion in the second direction is less than a width of the second portion in the second direction.

9. An integrated circuit device comprising:
a substrate including a first active area, a second active area, and a fin-type active area on the first active area and the second active area,
the fin-type active area extending on the substrate in a first direction parallel to an upper surface of the substrate;
a first gate line crossing the fin-type active area on the first active area and the second active area, the first gate line extending in a second direction perpendicular to the first direction;
a first cut gate line spaced apart from the first gate line with a first gate separation insulation layer therebetween, the first cut gate line extending in the second direction;
a second cut gate line spaced apart from the first gate line with a second gate separation insulation layer therebetween, the second cut gate line extending in the second direction;
a first wiring line on the first cut gate line and extending in the first direction;
a second wiring line on the second cut gate line and extending in the first direction;
a source/drain area adjacent to a sidewall of the first gate line on the fin-type active area; and
a source/drain contact connected to the source/drain area, wherein
the source/drain contact includes a first portion and a second portion under the first portion,
a width of the first portion in the second direction is less than a width of the second portion in the second direction, and
a contiguous portion of the first wiring line on the first cut gate line overlaps the first gate separation insulation layer, the first cut gate line, and the second gate separation insulation layer.

10. The integrated circuit device of claim 9, further comprising:
a second gate line on the substrate, wherein
the first gate line, the first gate separation insulation layer, the first cut gate line, the second cut gate line, and the second gate line are disposed on a straight line, and the first cut gate line overlaps a midpoint in the second direction between the first gate line and the second gate line.

11. The integrated circuit device of claim 9, wherein
the first gate line comprises a gate insulation layer, a first gate electrode, and a second gate electrode, and
the gate insulation layer contacts a sidewall of the first gate separation insulation layer.

12. The integrated circuit device of claim 9, wherein
the first gate line comprises a gate insulation layer, a first gate electrode, and a second gate electrode, and
the gate insulation layer, the first gate electrode, and the second gate electrode contact a sidewall of the first gate separation insulation layer.

13. The integrated circuit device of claim 9, wherein
the first gate separation insulation layer has a first width in the second direction,
the second gate separation insulation layer has a second width in the second direction, and
the second width is different from the first width.

14. The integrated circuit device of claim 9, wherein
the first gate separation insulation layer comprises a first insulating material,
the second gate separation insulation layer comprises a second insulating material.

15. The integrated circuit device of claim 9, further comprising:
a gate contact on the first gate line, wherein
an upper surface of the second portion is at a level lower than an upper surface of the first portion.

16. An integrated circuit device comprising:
a substrate including a fin-type active area extending in a first direction parallel to an upper surface of the substrate,
the substrate defining a plurality of cell areas,
the plurality of cell areas including a first cell area and a second cell area adjacent to the first cell area,
the first cell area including a first gate line extending in a second direction perpendicular to the first direction on the substrate, a cut gate line extending in the second direction and being spaced apart from the first gate line with a first gate cut area therebetween, and a second gate line extending in the second direction and being spaced apart from the cut gate line with a second gate cut area therebetween,
the second cell area including a third gate line extending in the second direction perpendicular to the first direction on the substrate, and a fourth gate line extending in the second direction and being spaced apart from the third gate line with a third gate cut area therebetween,
the cut gate line overlapping a midpoint in the second direction between the first gate line and the second gate line wherein
a contiguous portion of a power wiring on the cut gate line overlaps the first gate cut area, the cut gate line, and the second gate cut area.

17. The integrated circuit device of claim 16, further comprising:
a power wiring on the cut gate line, the first gate cut area, and the second gate cut area.

18. The integrated circuit device of claim 16, wherein the first gate line, the cut gate line, and the second gate line are disposed on a straight line, and the cut gate line overlaps a midpoint in the second direction between the first gate line and the second gate line.

19. The integrated circuit device of claim 16, further comprising:
a gate contact on the first gate line;
a source/drain area adjacent to a sidewall of the first gate line on the fin-type active area; and
a source/drain contact connected to the source/drain area, wherein
the source/drain contact includes a first portion and a second portion,
an upper surface of the second portion is at a level lower than an upper surface of the first portion, and
a width of the first portion in the second direction is less than a width of the second portion in the second direction.

20. The integrated circuit device of claim 16, further comprising:
a first gate separation insulation layer in the first gate cut area and in contact with a first sidewall of the cut gate line; and
a second gate separation insulation layer in the second gate cut area and in contact with a second sidewall of the cut gate line.

* * * * *